US012016230B2

(12) United States Patent
Chae et al.

(10) Patent No.: US 12,016,230 B2
(45) Date of Patent: *Jun. 18, 2024

(54) DISPLAY APPARATUS

(71) Applicant: Samsung Display Co., Ltd., Yongin-si (KR)

(72) Inventors: Jongwon Chae, Yongin-si (KR); Yongje Jeon, Yongin-si (KR); Moosoon Ko, Yongin-si (KR); Sunghoon Moon, Yongin-si (KR); Sewan Son, Yongin-si (KR); Jingoo Jung, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 129 days.

This patent is subject to a terminal disclaimer.

(21) Appl. No.: 17/075,094

(22) Filed: Oct. 20, 2020

(65) Prior Publication Data
US 2021/0143231 A1 May 13, 2021

(30) Foreign Application Priority Data
Nov. 13, 2019 (KR) .................. 10-2019-0145399

(51) Int. Cl.
H10K 59/35 (2023.01)
H10K 59/122 (2023.01)
(Continued)

(52) U.S. Cl.
CPC ......... H10K 59/353 (2023.02); H10K 59/352 (2023.02); H10K 59/122 (2023.02);
(Continued)

(58) Field of Classification Search
CPC .... H01L 27/3216–3218; H10K 59/352; H10K 59/353; H10K 59/122; H10K 59/124; H10K 59/126
See application file for complete search history.

(56) References Cited

U.S. PATENT DOCUMENTS 8,247,966 B2 8/2012 Lee et al.
8,552,635 B2 10/2013 Kim et al.
(Continued)

FOREIGN PATENT DOCUMENTS

CN 107194321 A 9/2017
CN 108376696 A 8/2018
(Continued)

OTHER PUBLICATIONS

EPO Partial European Search Report dated Feb. 23, 2021, issued in corresponding European Patent Application No. 20197263.5 (20 pages).
(Continued)

Primary Examiner — Eric K Ashbahian
(74) Attorney, Agent, or Firm — Lewis Roca Rothgerber Christie LLP

(57) ABSTRACT

A display apparatus includes: a substrate; a first display area on the substrate; main subpixels at the first display area; a second display area on the substrate; and a basic unit at the second display area, the basic unit including auxiliary subpixels and a transmission portion. A pixel layout of the auxiliary subpixels is different from a pixel layout of the main subpixels, and a size of a light-emission area of a first auxiliary subpixel from among the auxiliary subpixels is greater than a size of a light-emission area of a first main subpixel from among the main subpixels, the first main subpixel representing the same color as that of the first auxiliary subpixel.

15 Claims, 10 Drawing Sheets

(51) Int. Cl.
*H10K 59/124* (2023.01)
*H10K 59/126* (2023.01)
*H10K 59/131* (2023.01)

(52) U.S. Cl.
CPC ......... *H10K 59/124* (2023.02); *H10K 59/126* (2023.02); *H10K 59/131* (2023.02)

(56) References Cited

U.S. PATENT DOCUMENTS

| | | |
|---|---|---|
| 8,872,797 B2 | 10/2014 | Lee et al. |
| 9,818,803 B2 | 11/2017 | Lee |
| 2016/0254338 A1 | 9/2016 | Lin et al. |
| 2017/0125506 A1 | 5/2017 | Kim |
| 2017/0256747 A1* | 9/2017 | Lee ................... H01L 27/3218 |
| 2018/0005561 A1* | 1/2018 | Moon ................ G09G 3/3208 |
| 2018/0089485 A1 | 3/2018 | Bok |
| 2019/0115411 A1* | 4/2019 | Park ................... H01L 51/5281 |
| 2019/0212788 A1 | 7/2019 | Kwak et al. |
| 2019/0237533 A1 | 8/2019 | Kim et al. |
| 2019/0393286 A1 | 12/2019 | Ding et al. |
| 2020/0019747 A1 | 1/2020 | Yang et al. |
| 2020/0119107 A1* | 4/2020 | Liu .................... H10K 59/353 |
| 2020/0133040 A1 | 4/2020 | Bang et al. |
| 2020/0194730 A1* | 6/2020 | Park .................. H10K 50/822 |
| 2020/0403043 A1 | 12/2020 | Xin et al. |
| 2021/0041923 A1 | 2/2021 | Bai |
| 2021/0065625 A1* | 3/2021 | Wang ................. H10K 59/35 |
| 2021/0074778 A1* | 3/2021 | Li ..................... G02F 1/16766 |
| 2021/0141693 A1 | 5/2021 | Liu et al. |
| 2021/0143231 A1 | 5/2021 | Chae et al. |
| 2021/0151517 A1* | 5/2021 | Zhu ................... H10K 50/852 |
| 2021/0193033 A1* | 6/2021 | Tan ................... G09G 3/3225 |
| 2021/0193749 A1* | 6/2021 | Kim .................. H01L 27/3216 |
| 2021/0273197 A1* | 9/2021 | Wang ................. H01L 27/3246 |
| 2022/0278186 A1* | 9/2022 | Choi ................... H10K 59/131 |
| 2022/0392963 A1* | 12/2022 | Chen ................... H10K 59/121 |

FOREIGN PATENT DOCUMENTS

| | | |
|---|---|---|
| CN | 108389879 A | 8/2018 |
| CN | 108881530 A | 11/2018 |
| CN | 109285868 A | 1/2019 |
| CN | 208507679 U | 2/2019 |
| CN | 208607570 U | 3/2019 |
| CN | 110444125 A | 11/2019 |
| EP | 3428967 A1 | 1/2019 |
| EP | 3588367 A1 | 1/2020 |
| KR | 10-1042955 B1 | 6/2011 |
| KR | 10-2011-0129531 A | 12/2011 |
| KR | 10-1158873 B1 | 6/2012 |
| KR | 10-2015-0033968 A | 4/2015 |
| KR | 10-1615332 B1 | 4/2016 |
| KR | 10-2017-0024182 A | 3/2017 |
| KR | 10-2017-0104097 | 9/2017 |
| KR | 10-1859105 B1 | 5/2018 |
| KR | 10-2020-0050059 | 5/2020 |
| TW | 201939733 A | 10/2019 |

OTHER PUBLICATIONS

U.S. Office Action from U.S. Appl. No. 17/006,028, dated Nov. 18, 2021, 35 pages.
EPO Extended European Search Report dated Jun. 17, 2021, issued in corresponding European Patent Application No. 20197263.5 (30 pages).
U.S. Final Office Action dated Jun. 30, 2022, issued in U.S. Appl. No. 17/006,028 (17 pages).
U.S. Advisory Action dated Sep. 28, 2022, issued in U.S. Appl. No. 17/006,028 (3 pages).
U.S. Office Action dated Oct. 31, 2022, issued in U.S. Appl. No. 17/006,028 (19 pages).
U.S. Final Office Action dated May 12, 2023, issued in U.S. Appl. No. 17/006,028 (19 pages).

* cited by examiner

DISPLAY APPARATUS

CROSS-REFERENCE TO RELATED APPLICATION

This application claims priority to and the benefit of Korean Patent Application No. 10-2019-0145399, filed on Nov. 13, 2019, in the Korean Intellectual Property Office, the entire disclosure of which is incorporated by reference herein.

BACKGROUND

1. Field

Aspects of one or more embodiments relate to a display apparatus.

2. Description of Related Art

Applications of display devices have recently diversified. Moreover, because display devices have become thinner and lighter, their range of use has increased.

Given that display apparatuses are utilized in various ways, various methods may be used to design the shapes of display apparatuses, and functions that may be connected or linked to display apparatuses may increase.

The above information disclosed in this Background section is for enhancement of understanding of the background of the present disclosure, and therefore, it may contain information that does not constitute prior art.

SUMMARY

One or more exemplary embodiments of the present disclosure are directed to a display apparatus including a first display area as a main display area and a second display area underneath which an optical element or the like may be arranged. However, the present disclosure is not limited thereto.

Additional aspects and features will be set forth in part in the description which follows and, in part, will be apparent from the description, or may be learned by practicing one or more example embodiments of the present disclosure.

According to one or more example embodiments of the present disclosure, a display apparatus includes: a substrate; a first display area on the substrate; main subpixels at the first display area; a second display area on the substrate; and a basic unit at the second display area, the basic unit including auxiliary subpixels and a transmission portion. A pixel layout of the auxiliary subpixels is different from a pixel layout of the main subpixels, and a size of a light-emission area of a first auxiliary subpixel from among the auxiliary subpixels is greater than a size of a light-emission area of a first main subpixel from among the main subpixels, the first main subpixel representing the same color as that of the first auxiliary subpixel.

In an example embodiment, the main subpixels may be arranged in a pentile matrix structure, and the auxiliary subpixels may be arranged in an S-stripe structure.

In an example embodiment, a corresponding unit including main subpixels and having the same area as that of the basic unit may be at the first display area, and a sum of light-emission areas of one or more first auxiliary subpixels included in the basic unit may be 0.5 to 1 times a sum of light-emission areas of the main subpixels included in the corresponding unit.

In an example embodiment, the first auxiliary subpixel and the first main subpixel may be configured to emit a blue light.

In an example embodiment, an area occupied by the transmission portion in the basic unit may be about ¾ of the area of the basic unit.

In an example embodiment, the auxiliary subpixels may constitute pixel groups that are spaced apart from each other within the basic unit.

In an example embodiment, the main subpixels may be arranged in a pentile matrix structure, and the auxiliary subpixels may be arranged in an S-stripe structure.

In an example embodiment, the main subpixels may be arranged in an RGBG pentile matrix structure, and the auxiliary subpixels may be arranged in an RBGB pentile matrix structure.

In an example embodiment, the display apparatus may further include an inorganic insulating layer on the substrate, and the inorganic insulating layer may have an opening corresponding to the transmission portion.

In an example embodiment, an opposite electrode covering the main subpixels and the auxiliary subpixels may extend on the first display area and the second display area, the opposite electrode being integrally formed and having an opening corresponding to the transmission portion.

According to one or more example embodiments of the present disclosure, a display apparatus includes: a substrate including a first display area and a second display area, the first display area including main subpixels, and the second display area including auxiliary subpixels and a transmission portion; a first main subpixel from among the main subpixels including a first pixel electrode and a first emission layer; a first auxiliary subpixel from among the auxiliary subpixels including a second pixel electrode and a second emission layer, the first auxiliary subpixel representing the same color as that of the first main subpixel; and an opposite electrode covering the first display area and the second display area, the opposite electrode being integrally formed. A pixel layout structure of the auxiliary subpixels is different from a pixel layout structure of the main subpixels, and a size of a light-emission area of the first auxiliary subpixel is greater than a size of a light-emission area of the first main subpixel.

In an example embodiment, the display apparatus may further include a functional layer between the first pixel electrode and the opposite electrode, and the functional layer may be located to correspond to the transmission portion.

In an example embodiment, the display apparatus may further include a pixel defining layer having a first opening and a second opening exposing center portions of the first pixel electrode and the second pixel electrode, respectively, and the light-emission area of the first main subpixel may be defined by the first opening, and the light-emission area of the first auxiliary subpixel may be defined by the second opening.

In an example embodiment, the display apparatus may further include an inorganic insulating layer on the substrate, and the inorganic insulating layer may have an opening corresponding to the transmission portion.

In an example embodiment, the first display area and the second display area may be sealed by an encapsulation substrate facing the substrate.

In an example embodiment, the display apparatus may further include a thin-film encapsulation layer including a first inorganic encapsulation layer, an organic encapsulation layer, and a second inorganic encapsulation layer sequentially on the opposite electrode.

In an example embodiment, the main subpixels may be arranged in a pentile matrix structure, and the auxiliary subpixels may be arranged in an S-stripe structure.

In an example embodiment, the first auxiliary subpixel and the first main subpixel may be configured to emit a blue light.

In an example embodiment, the main subpixels may be arranged in a pentile matrix structure, and the auxiliary subpixels may be arranged in an S-stripe structure.

In an example embodiment, the main subpixels may be arranged in an RGBG pentile matrix structure, and the auxiliary subpixels may be arranged in an RBGB pentile matrix structure.

BRIEF DESCRIPTION OF THE DRAWINGS

The above and other aspects and features of the present disclosure will become more apparent to those skilled in the art from the following detailed description of the example embodiments with reference to the accompanying drawings, in which.

DETAILED DESCRIPTION

Figure 1:
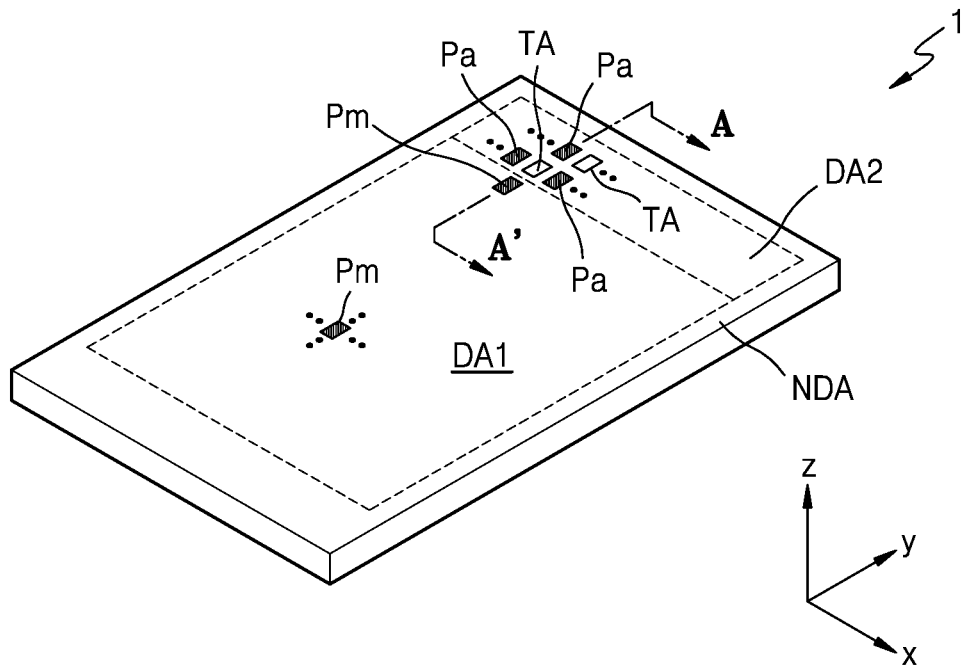
FIG. 1 is a schematic perspective view of a display apparatus according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Further, when a particular embodiment may be implemented differently, a specific process order may be different from a described one. For example, two processes that are consecutively described may be performed at the same or substantially at the same time, or may be performed in an order opposite to the described order. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element, layer, or component, for example, such as a film, an area, a plate, and/or the like, is referred to as being "on," "connected to," or "coupled to" another element, layer, or component, it can be directly on, connected to, or coupled to the other element, layer, or component, or one or more intervening elements, layers, or components may be present. In addition, it will also be understood that when an element, layer, or component is referred to as being "between" two elements, layers, or components, it can be the only element, layer, or component between the two elements, layers, or components, or one or more intervening elements, layers, or components may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, "A and/or B" refers to A or B, or A and B. Expressions such as "at least one of," when preceding a list of elements, modify the entire list of elements and do not modify the individual elements of the list. For example, the expression "at least one of a, b, and c" may indicate only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic perspective view of a display apparatus 1 according to an embodiment.

Referring to FIG. 1, the display apparatus 1 includes a first display area DA1 where an image is realized (e.g., where an image is displayed), and a non-display area NDA where no images are realized (e.g., where no images are displayed). The display apparatus 1 may provide a main image by using light emitted from a plurality of main subpixels Pm arranged at (e.g., in or on) the first display area DA1.

The display apparatus 1 includes a second display area DA2. The second display area DA2 may be an area underneath which a component, for example, such as a sensor using infrared light, visible light, and/or sound, is arranged. This will be described in more detail below with reference to FIG. 2. The second display area DA2 may include a transmission portion TA capable of transmitting (e.g., configured to transmit) light and/or sound therethrough that is output from a component towards the outside or that travels from the outside towards the component. According to an embodiment, when light is transmitted through the second display area DA2, a light transmittance of the second display area DA2 may be about 30% or greater, for example, such as 50% or greater, 75% or greater, 80% or greater, 85% or greater, or 90% or greater.

According to an embodiment, a plurality of auxiliary subpixels Pa may be arranged at (e.g., in or on) the second display area DA2, and an image (e.g., a certain image) may be provided using light emitted by the plurality of auxiliary subpixels Pa. An image provided by the second display area DA2 may be an auxiliary image, and thus, may have a lower resolution than an image provided by the first display area DA1. In other words, because the second display area DA2 includes the transmission portion TA capable of transmitting light and/or sound therethrough, the number of auxiliary subpixels Pa arranged on a unit area at (e.g., in or on) the second display area DA2 may be less than the number of main subpixels Pm arranged on the unit area at (e.g., in or on) the first display area DA1.

The second display area DA2 may be arranged at (e.g., in or on) one side of the first display area DA1. For example, in an embodiment, as shown in FIG. 1, the second display area DA2 may be arranged at (e.g., in or on) an upper side of the first display area DA1, and thus, the second display area DA2 may be between the non-display area NDA and the first display area DA1. However, the present disclosure is not limited thereto, and various modifications may be made to the second display area DA2. For example, in another embodiment, the second display area DA2 may be surrounded (e.g., around a periphery thereof) by the first display area DA1.

Although an organic light-emitting display is illustrated in the figures and will now be described in more detail as an illustrative example of the display apparatus 1, the present disclosure is not limited thereto. For example, according to other embodiments, various suitable kinds of display apparatuses, such as an inorganic light-emitting display, a quantum dot light-emitting display, and/or the like, may be used in the display apparatus 1.

Although the first display area DA1 having a rectangular shape in a plan view (e.g., a view from a plane that is parallel to or substantially parallel to a top surface of the display apparatus 1) is illustrated in FIG. 1, such that the second display area DA2 may be arranged at (e.g., in or on the upper side) of the first display area DA1, the present disclosure is not limited thereto. For example, the shape of the first display area DA1 in the plan view may be a circle, an oval, a polygon, such as a triangle or a pentagon, and/or the like. Further, the second display area DA2 may be located within (e.g., inside) the first display area DA1, and/or may have various suitable shapes.

Figure 2:
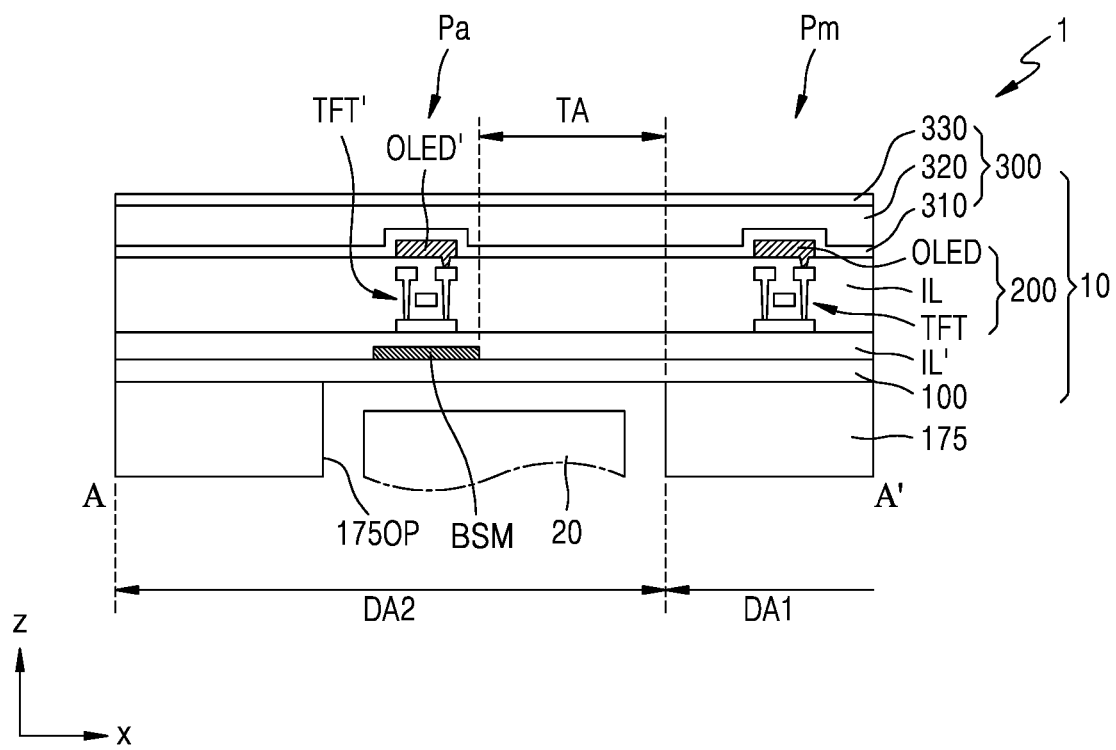
FIG. 2 is a schematic cross-sectional view of a display apparatus according to an embodiment.

FIG. 2 is a schematic cross-sectional view of the display apparatus 1 according to an embodiment, and may correspond to a cross-section taken along the line A-A' of FIG. 1.

Referring to FIG. 2, the display apparatus 1 may include a display panel 10 including a display element, and a component 20 corresponding to the second display area DA2.

The display panel 10 may include a substrate 100, a display element layer 200 disposed on the substrate 100, and a thin-film encapsulation layer 300 on the display element layer 200. The thin-film encapsulation layer 300 may be an encapsulation member that seals the display element layer 200. The display panel 10 may further include a lower protection film 175 arranged below the substrate 100.

The substrate 100 may include glass and/or polymer resin. Examples of the polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may have flexible, rollable, and/or bendable characteristics. The substrate 100 may have a multi-layered structure including, for example, a layer including one or more of the aforementioned polymer resins, and an inorganic layer.

The display element layer 200 may include a circuit layer including first and second thin-film transistors TFT and TFT', main and auxiliary organic light-emitting diodes OLED and OLED' as display elements, and insulating layers IL and IL' between the circuit layer and the main and auxiliary organic light emitting diodes OLED and OLED'.

A main subpixel Pm, including the first thin-film transistor TFT and the main organic light-emitting diode OLED connected to the first thin-film transistor TFT, may be arranged at (e.g., in or on) the first display area DA1. An auxiliary subpixel Pa, including the second thin-film transistor TFT' and the auxiliary organic light-emitting diode OLED' connected to the second thin-film transistor TFT', may be arranged at (e.g., in or on) the second display area DA2.

A transmission portion TA, which may have no display elements arranged thereon, may be arranged at (e.g., in or on) the second display area DA2. The transmission portion TA may be understood as a transmission area that transmits a light/signal therethrough that is emitted by the component 20, and/or that transmits a light/signal therethrough that is incident upon the component 20.

The component 20 may be located at (e.g., in or on) the second display area DA2. The component 20 may be an electronic element (e.g., an electronic device) that uses light and/or sound. For example, the component 20 may be a sensor that receives and uses light, for example, such as an infrared sensor, a sensor that outputs and senses light and/or sound to measure a distance or to recognize a fingerprint and/or the like, a lamp (e.g., a small lamp) that outputs light, a speaker that outputs sound, and/or the like. An electronic element that uses light may use light in various suitable wavelength bands, for example, such as visible light, infrared light, and/or ultraviolet light. A plurality of components 20 may be arranged at (e.g., in or on) the second display area DA2. For example, in an embodiment, a light-emitting device and a light-receiving device as the component 20 may both be included in a single second display area DA2. In another embodiment, both a light-emitting portion and a light-receiving portion may be included in a single component 20.

A lower electrode layer BSM may be arranged at (e.g., in or on) the second display area DA2. The lower electrode layer BSM may be arranged to correspond to an area below the second thin-film transistor TFT'. The lower electrode layer BSM may prevent or substantially prevent external light from reaching the auxiliary subpixel Pa including the second thin-film transistor TFT' and the like. For example, the lower electrode layer BSM may prevent or substantially prevent light emitted from the component 20 from reaching the auxiliary subpixel Pa.

According to an embodiment, a static voltage or a signal may be applied to the lower electrode layer BSM, and thus, the lower electrode layer BSM may prevent or substantially prevent a pixel circuit from being damaged by an electrostatic discharge.

The thin-film encapsulation layer 300 may include at least one inorganic encapsulation layer and at least one organic encapsulation layer. For example, FIG. 2 illustrates that the thin-film encapsulation layer 300 may include first and second inorganic encapsulation layers 310 and 330, and an organic encapsulation layer 320 therebetween.

The first and second inorganic encapsulation layers 310 and 330 may include at least one inorganic insulating material, for example, such as aluminum oxide, titanium oxide, tantalum oxide, hafnium oxide, zinc oxide, silicon oxide, silicon nitride, silicon oxynitride, and/or the like. The organic encapsulation layer 320 may include, for example, a polymer-based material. Examples of the polymer-based material may include, for example, an acrylic resin, an epoxy-based resin, polyimide, and polyethylene.

The lower protection film 175 may be attached to a lower surface of the substrate 100, and may support and/or protect the substrate 100. The lower protection film 175 may include an opening 175OP corresponding to the second display area DA2. The lower protection film 175 may improve the light transmittance of the second display area DA2 by including the opening 175OP. The lower protection film 175 may include, for example, polyethylene terephthalate (PET) or polyimide (PI).

The second display area DA2 may have a larger area than an area where the component 20 is arranged. Accordingly, the area of the opening 175OP included in the lower protection film 175 may not be the same as (e.g., may not be identical with) the area of the second display area DA2. For example, the area of the opening 175OP may be less than (e.g., may be smaller than) the area of the second display area DA2.

A plurality of components 20 may be arranged at (e.g., in or on) the second display area DA2. The plurality of components 20 may perform different functions from each other. For example, one of the plurality of components 20 may be a camera, and another one of the plurality of components 20 may be an infrared sensor.

In an embodiment, various other layers, elements, members, and/or components may be arranged on the display panel 10, for example, such as an input sensing member for sensing a touch input, an anti-reflection member including a polarizer and/or a retarder, a color filter and/or a black matrix, a transparent window, and/or the like.

According to an embodiment, the thin-film encapsulation layer 300 may be used as an encapsulation member that seals the display element layer 200, but the present disclosure is not limited thereto. For example, an encapsulation substrate connected with or attached to the substrate 100 by a sealant or frit may be used as a member that seals the display element layer 200.

Figure 3A:
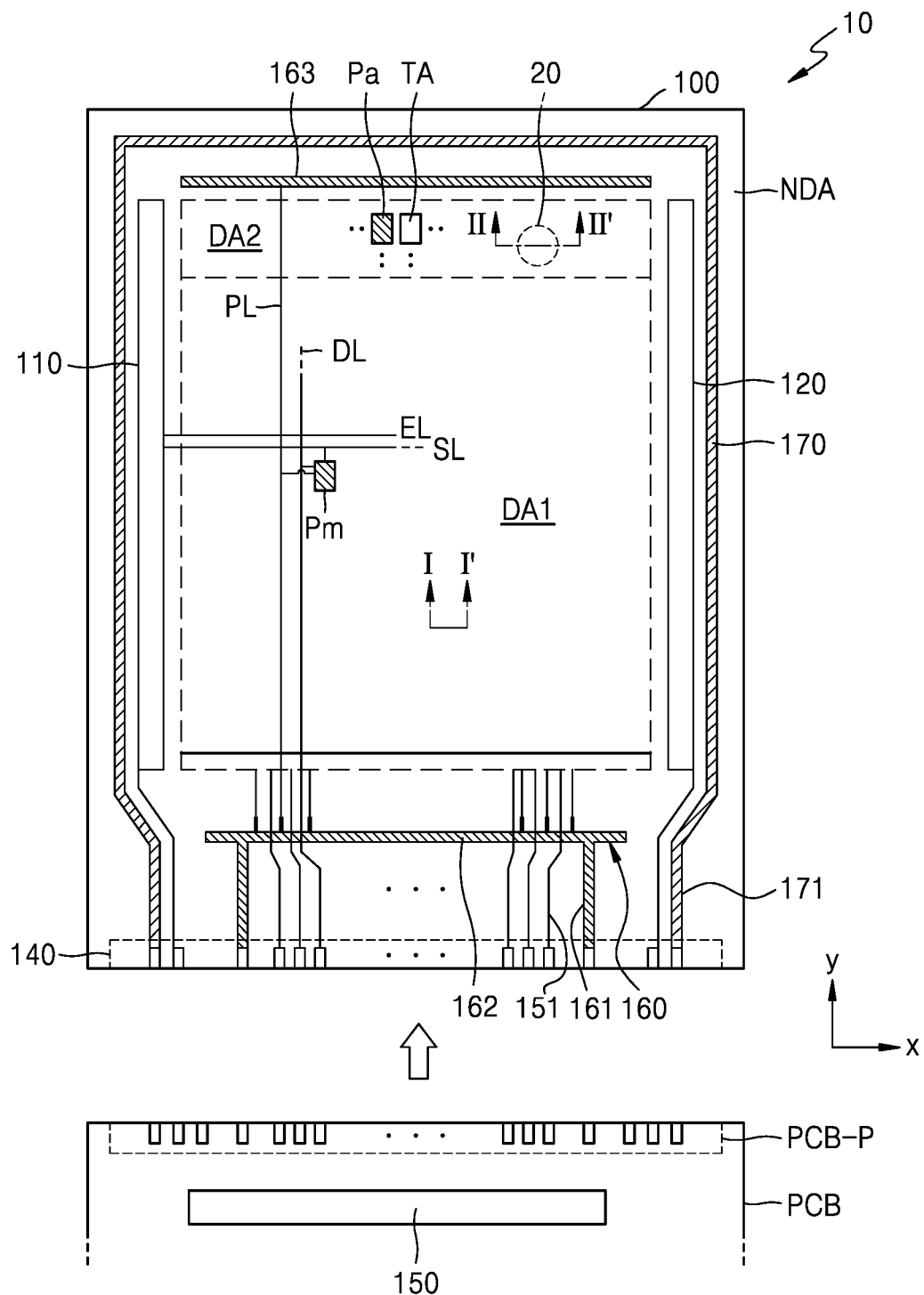
FIG. 3A is a schematic plan view of a display apparatus according to an embodiment.

FIG. 3A is a schematic plan view of the display panel 10 according to an embodiment.

Referring to FIG. 3A, the display panel 10 may include (e.g., may be arranged in) the first display area DA1 and the second display area DA2. The first display area DA1 includes a plurality of main subpixels Pm. Each of the main subpixels Pm may include a display element, for example, such as an organic light-emitting diode. Each of the main subpixels Pm may emit light via the organic light-emitting diode, for example, a red light, a green light, a blue light, or a white light. The first display area DA1 may be protected from ambient air and/or moisture by being covered by the encapsulation member described above with reference to FIG. 2.

The second display area DA2 may be arranged at (e.g., in or on) one side of the first display area DA1, and a plurality of auxiliary subpixels Pa may be arranged at (e.g., in or on) the second display area DA2. Each of the auxiliary subpixels Pa may include a display element, for example, such as an organic light-emitting diode. Each of the auxiliary subpixels Pa may emit light via the organic light-emitting diode, for example, a red light, a green light, a blue light, or a white light. A transmission portion TA may be arranged between the auxiliary subpixels Pa at (e.g., in or on) the second display area DA2. At least one component 20 may be arranged at (e.g., in or on) a lower portion of the second display area DA2 of the display panel 10. For example, the component 20 may be arranged underneath the substrate 100 at (e.g., in or on) the second display area DA2, but the present disclosure is not limited thereto.

According to an embodiment, one main subpixel Pm and one auxiliary subpixel Pa may include the same or substantially the same pixel circuit (e.g., pixel circuit structure) as each other. However, the present disclosure is not limited thereto. For example, in another embodiment, the main subpixel Pm and the auxiliary subpixel Pa may include different pixel circuits (e.g., different pixel circuit structures) from each other. Because the second display area DA2 includes the transmission portion TA, the second display area DA2 may have a lower (e.g., a smaller) resolution than that of the first display area DA1.

Each of the main subpixel Pm and the auxiliary subpixel Pa may be electrically connected to one or more outer circuits arranged at (e.g., in or on) the non-display area NDA. For example, a first scan driving circuit 110, a second scan driving circuit 120, a terminal 140, a data driving circuit 150, a first power supply line 160, and a second power supply line 170 may be arranged at (e.g., in or on) the non-display area NDA.

The first scan driving circuit 110 may provide a scan signal to at least some of the main and auxiliary subpixels Pm and Pa via a corresponding scan line SL. The first scan driving circuit 110 may provide a light-emission control signal to at least some of the main and auxiliary subpixels Pm and Pa via a corresponding light-emission control line EL. The second scan driving circuit 120 may be arranged at an opposite side of the first display area DA1 than that of the first scan driving circuit 110 with the first display area DA1 therebetween. In this case, some of the main and auxiliary subpixels Pm and Pa may be electrically connected to the first scan driving circuit 110 to receive the scan signal and/or the light-emission control signal from the first scan driving circuit 110, and others of the main and auxiliary subpixels Pm and Pa may be electrically connected to the second scan driving circuit 120 to receive the scan signal and/or the light-emission control signal from the second scan driving circuit 120. However the present disclosure is not limited thereto, for example, according to another embodiment, the second scan driving circuit 120 may be omitted (e.g., may not be included). In this case, the first scan driving circuit 110 may provide a scan signal to each of the main and auxiliary subpixels Pm and Pa via a corresponding scan line SL, and a light-emission control signal to each of the main and auxiliary subpixels Pm and Pa via a corresponding light-emission control line EL.

The terminal 140 may be disposed on one side of the substrate 100. The terminal 140 may be exposed without being covered by an insulating layer, and may be electrically connected to a printed circuit board PCB. A terminal PCB-P of the printed circuit board PCB may be electrically connected to the terminal 140 of the display panel 10. The printed circuit board PCB may transmit a signal and/or a power of a controller to the display panel 10. A control signal generated by the controller may be transmitted to each of the first and second scan driving circuits 110 and 120 via the printed circuit board PCB. The controller may provide a first power, for example, a first power supply voltage ELVDD of FIGS. 4A and 4B, and a second power, for example, a second power supply voltage ELVSS of FIGS. 4A and 4B, to the first and second power supply lines 160 and 170 via first and second connection lines 161 and 171, respectively. The first power supply voltage ELVDD may be provided to each of the main and auxiliary subpixels Pm and Pa via a driving voltage line PL connected to the first power supply line 160, and the second power supply voltage ELVSS may be provided to an opposite electrode of each of the main and auxiliary subpixels Pm and Pa connected to the second power supply line 170.

The data driving circuit 150 is electrically connected to a data line DL. A data signal of the data driving circuit 150 may be provided to each of the main and auxiliary subpixels Pm and Pa via a corresponding connection line 151 connected to the terminal 140, and a corresponding data line DL connected to the corresponding connection line 151. FIG. 3A illustrates an arrangement of the data driving circuit 150 on the printed circuit board PCB. However, the present disclosure is not limited thereto, and according to another embodiment, the data driving circuit 150 may be arranged on the substrate 100. For example, the data driving circuit 150 may be arranged on the substrate 100 between the terminal 140 and the first power supply line 160.

The first power supply line 160 may include a first sub-wire 162 and a second sub-wire 163, each extending in an x-axis direction and being parallel to each other with the first display area DA1 therebetween. The second power supply line 170 may partially surround (e.g., around a periphery of) the first display area DA1, and may have a loop shape with one open side.

Figure 3B:
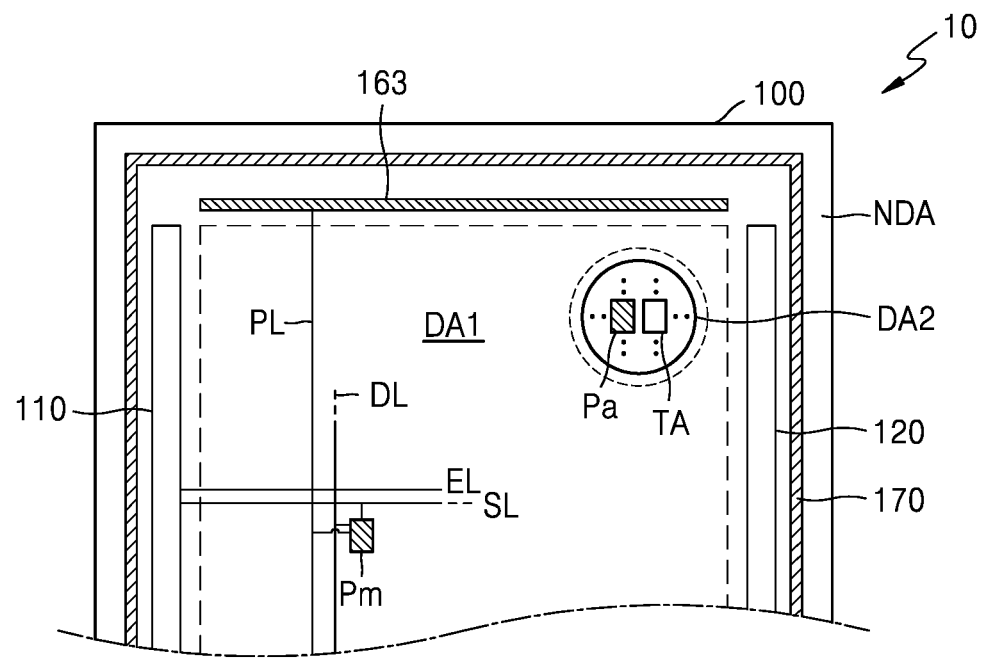
FIG. 3B is a schematic plan view of a portion of a display apparatus according to another embodiment.

Although FIG. 3A shows that the second display area DA2 is arranged at (e.g., in or on) one side of the first display area DA1, the present disclosure is not limited thereto. For example, as shown in FIG. 3B, the second display area DA2 may be included as an area corresponding to a sensor and/or the like that is arranged underneath the second display area DA2 (e.g., underneath the substrate 100 at the second display area DA2). In this case, the second display area DA2 may be arranged within (e.g., inside) the first display area DA1 and the may be surrounded (e.g., around a periphery thereof) by the first display area DA1.

Figure 4A:
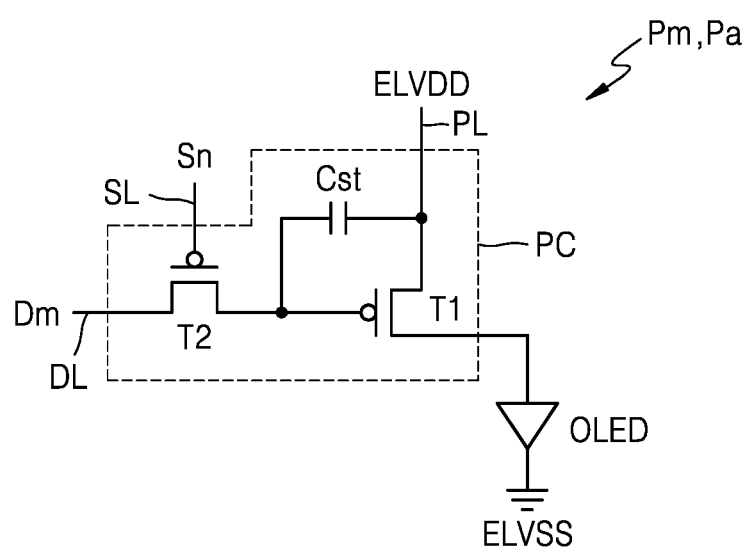
FIG. 4A is an equivalent circuit diagram of a pixel that may be arranged in a display area and/or a sensor area of a display apparatus according to an embodiment.
Figure 4B:
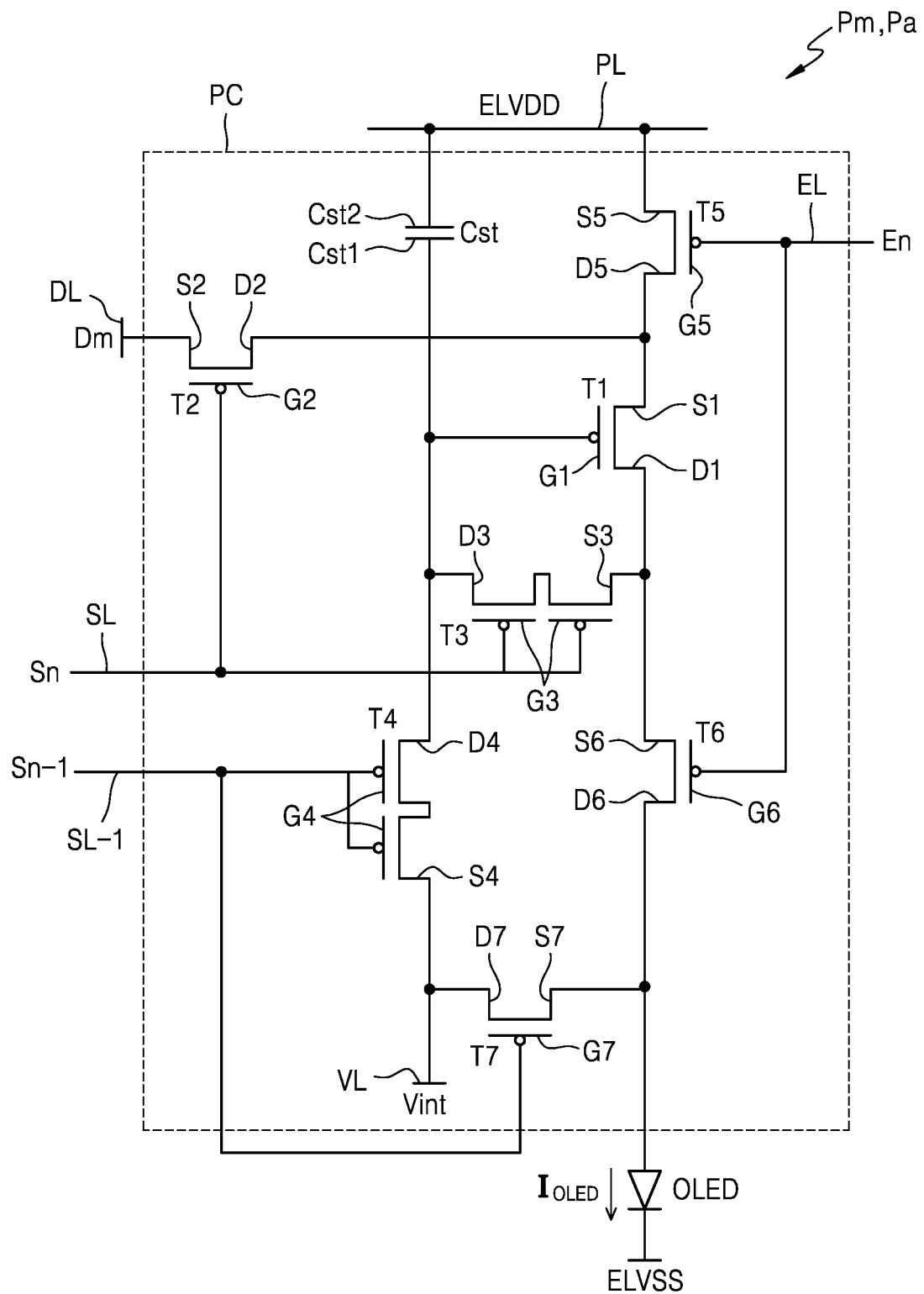
FIG. 4B is an equivalent circuit diagram of a pixel that may be arranged in a display area and/or a sensor area of a display apparatus according to another embodiment.

FIGS. 4A and 4B are equivalent circuit diagrams of a first pixel and/or a second pixel that may be included in a display panel according to one or more embodiments.

Referring to FIG. 4A, each subpixel Pm and/or Pa includes a pixel circuit PC connected to a scan line SL and a data line DL, and an organic light-emitting diode OLED connected to the pixel circuit PC.

The pixel circuit PC includes a driving thin-film transistor (TFT) T1, a switching TFT T2, and a storage capacitor Cst. The switching TFT T2 is connected to the scan line SL and the data line DL, and transmits a data signal Dm received via the data line DL to the driving TFT T1 according to a scan signal Sn received via the scan line SL.

The storage capacitor Cst is connected to the switching TFT T2 and a driving voltage line PL. The storage capacitor Cst stores a voltage corresponding to a difference between a voltage received from the switching TFT T2 and the first power supply voltage ELVDD (e.g., which may be referred to as a driving voltage) supplied to the driving voltage line PL.

The driving TFT T1 is connected to the driving voltage line PL and the storage capacitor Cst. The driving TFT T1 may control a driving current flowing from the driving voltage line PL to the organic light-emitting diode OLED in accordance with a voltage value stored in the storage capacitor Cst. The organic light-emitting diode OLED may emit light having a desired brightness due to the driving current.

Although FIG. 4A illustrates a case where the pixel circuit PC includes two TFTs and one storage capacitor, the present disclosure is not limited thereto. For example, as shown in FIG. 4B, the pixel circuit PC may include seven TFTs T1 to T7 and one storage capacitor Cst.

Referring to FIG. 4B, each subpixel Pm and/or Pa includes a pixel circuit PC, and an organic light-emitting diode OLED connected to the pixel circuit PC. The pixel circuit PC may include a plurality of TFTs and a storage capacitor. The TFTs and the storage capacitor may be connected to signal lines SL, SL-1, EL, and DL, an initializing voltage line VL, and a driving voltage line PL.

Although FIG. 4B shows that each subpixel Pm and/or Pa is connected to the signal lines SL, SL-1, EL, and DL, the initializing voltage line VL, and the driving voltage line PL, the present disclosure is not limited thereto. For example, according to another embodiment, the initializing voltage line VL, the driving voltage line PL, and at least one of the signal lines SL, SL-1, EL, and DL may be shared by adjacent pixels (e.g., by neighboring pixels).

The plurality of TFTs may include a driving TFT T1, a switching TFT T2, a compensating TFT T3, a first initializing TFT T4, an operation control TFT T5, a light-emission control TFT T6, and a second initializing TFT T7.

The signal lines SL, SL-1, EL, and DL may include a scan line SL that transmits a scan signal Sn, a previous scan line SL-1 that transmits a previous scan signal Sn-1 to the second initializing TFT T7, a light-emission control line EL that transmits a light-emission control signal En to the operation control TFT T5 and the light-emission control TFT T6, and a data line DL that crosses the scan line SL and transmits a data signal Dm. The driving voltage line PL transmits a driving voltage ELVDD to the driving TFT T1, and the initializing voltage line VL transmits an initializing voltage Vint that initiates the driving TFT T1 and a pixel electrode of the organic light-emitting diode OLED.

The driving TFT T1 includes a driving gate electrode G1 connected to a first electrode Cst1 of the storage capacitor Cst, a driving source electrode S1 connected to the driving voltage line PL via the operation control TFT T5, and a driving drain electrode D1 electrically connected to the pixel electrode of the organic light-emitting diode OLED via the light-emission control TFT T6. The driving TFT T1 receives the data signal Dm according to a switching operation of the switching TFT T2, and supplies a driving current $I_{OLED}$ to the organic light-emitting diode OLED.

The switching TFT T2 includes a switching gate electrode G2 connected to the scan line SL, a switching source electrode S2 connected to the data line DL, and a switching drain electrode D2 connected to the driving source electrode S1 of the driving TFT T1 and to the driving voltage line PL via the operation control TFT T5. The switching TFT T2 is turned on according to the scan signal Sn received via the scan line SL, and performs a switching operation of transmitting the data signal Dm received from the data line DL to the driving source electrode S1 of the driving TFT T1.

The compensating TFT T3 includes a compensating gate electrode G3 connected to the scan line SL, and a compensating source electrode S3 connected to the driving drain electrode D1 of the driving TFT T1 and to the pixel electrode of the organic light-emitting diode OLED via the light-emission control TFT T6. A compensating drain electrode D3 of the compensating TFT T3 is connected to the first electrode Cst1 of the storage capacitor Cst, a first initializing drain electrode D4 of the first initializing TFT T4, and the driving gate electrode G1 of the driving TFT T1. The compensating TFT T3 is turned on according to the scan signal Sn received via the scan line SL, and electrically connects the driving gate electrode G1 and the driving drain electrode D1 of the driving TFT T1 to each other, such that the driving TFT T1 is diode-connected.

The first initializing TFT T4 includes a first initializing gate electrode G4 connected to the previous scan line SL-1, and a first initializing source electrode S4 connected to a second initializing drain electrode D7 of the second initializing TFT T7 and to the initializing voltage line VL. The first initializing drain electrode D4 of the first initializing TFT T4 is connected to the first electrode Cst1 of the storage capacitor Cst, the compensating drain electrode D3 of the compensating TFT T3, and the driving gate electrode G1 of the driving TFT T1. The first initializing TFT T4 is turned on according to the previous scan signal Sn-1 received via the previous scan line SL-1, and transmits the initializing voltage Vint to the driving gate electrode G1 of the driving TFT T1 to initialize a voltage of the driving gate electrode G1 of the driving TFT T1.

The operation control TFT T5 includes an operation control gate electrode G5 connected to the light-emission control line EL, an operation control source electrode S5 connected to the driving voltage line PL, and an operation control drain electrode D5 connected to the driving source electrode S1 of the driving TFT T1 and to the switching drain electrode D2 of the switching TFT T2.

The light-emission control TFT T6 includes a light-emission control gate electrode G6 connected to the light-emission control line EL, and a light-emission control source electrode S6 connected to the driving drain electrode D1 of the driving TFT T1 and to the compensating source electrode S3 of the compensating TFT T3. A light-emission control drain electrode D6 of the light-emission control TFT T6 may be electrically connected to a second initializing source electrode S7 of the second initializing TFT T7 and to the pixel electrode of the organic light-emitting diode OLED.

The operation control TFT T5 and the light-emission control TFT T6 may be concurrently (e.g., simultaneously) turned on according to the light-emission control signal En received via the light-emission control line EL, and thus, the driving voltage ELVDD may be transmitted to the organic light-emitting diode OLED such that the driving current $I_{OLED}$ may flow in the organic light-emitting diode OLED.

The second initializing TFT T7 includes a second initializing gate electrode G7 connected to the previous scan line SL-1, the second initializing source electrode S7 connected to the light-emission control drain electrode D6 of the light-emission control TFT T6 and to the pixel electrode of the organic light-emitting diode OLED, and the second initializing drain electrode D7 connected to the first initializing source electrode S4 of the first initializing TFT T4 and to the initializing voltage line VL. The second initializing TFT T7 is turned on according to the previous scan signal Sn-1 received via the previous scan line SL-1, and initializes the pixel electrode of the organic light-emitting diode OLED.

Although FIG. 4B illustrates that the first initializing TFT T4 and the second initializing TFT T7 are connected to the previous scan line SL-1, the present disclosure is not limited thereto. For example, according to another embodiment, the first initializing TFT T4 may be connected to the previous scan line SL-1 to operate according to the previous scan signal Sn-1, and the second initializing TFT T7 may be connected to a separate signal line (e.g., a subsequent scan line) to operate according to a signal transmitted to the separate signal line.

A second electrode Cst2 of the storage capacitor Cst is connected to the driving voltage line PL, and an opposite electrode of the organic light-emitting diode OLED is connected to a common voltage ELVSS. Accordingly, the organic light-emitting diode OLED may receive the driving current $I_{OLED}$ from the driving TFT T1, and may emit light according to the driving current $I_{OLED}$, thereby displaying an image.

Although FIG. 4B illustrates that each of the compensating TFT T3 and the first initializing TFT T4 has a dual gate electrode, the present disclosure is not limited thereto. For example, in another embodiment, at least one of (e.g., each of) the compensating TFT T3 and the first initializing TFT T4 may have a single gate electrode.

According to an embodiment, the main subpixel Pm and the auxiliary subpixel Pa may include the same or substantially the same pixel circuit PC structure as each other. However, the present disclosure is not limited thereto, and the main subpixel Pm and the auxiliary subpixel Pa may include pixel circuits PC having different structures from each other. For example, in this case, in an embodiment, the main subpixel Pm may employ the pixel circuit PC of FIG. 4B, and the auxiliary subpixel Pa may employ the pixel circuit PC of FIG. 4A.

Figure 5:
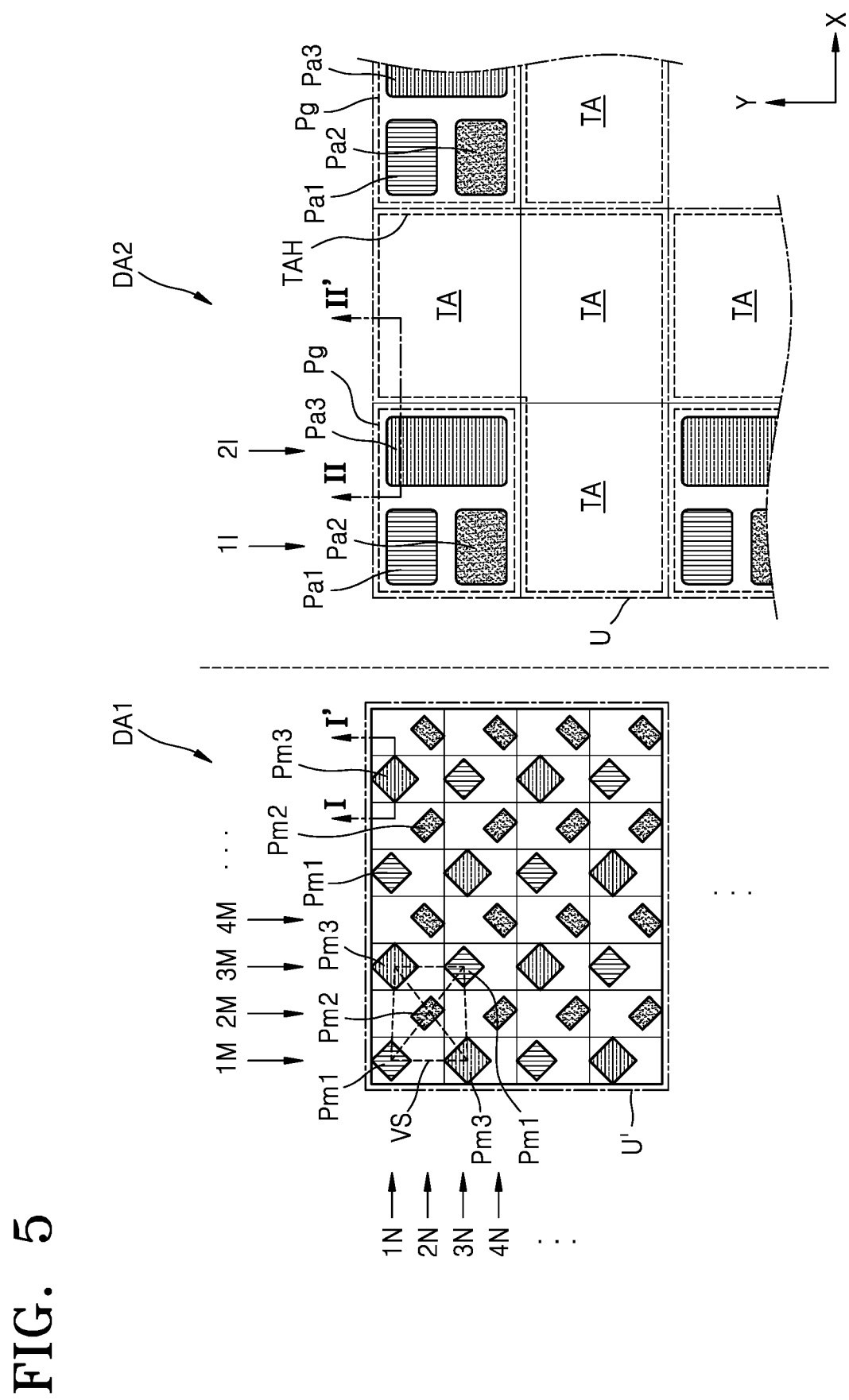
FIG. 5 is a schematic plan view illustrating an arrangement of subpixels and transmission portions in a first display area and a second display area.
Figure 6:
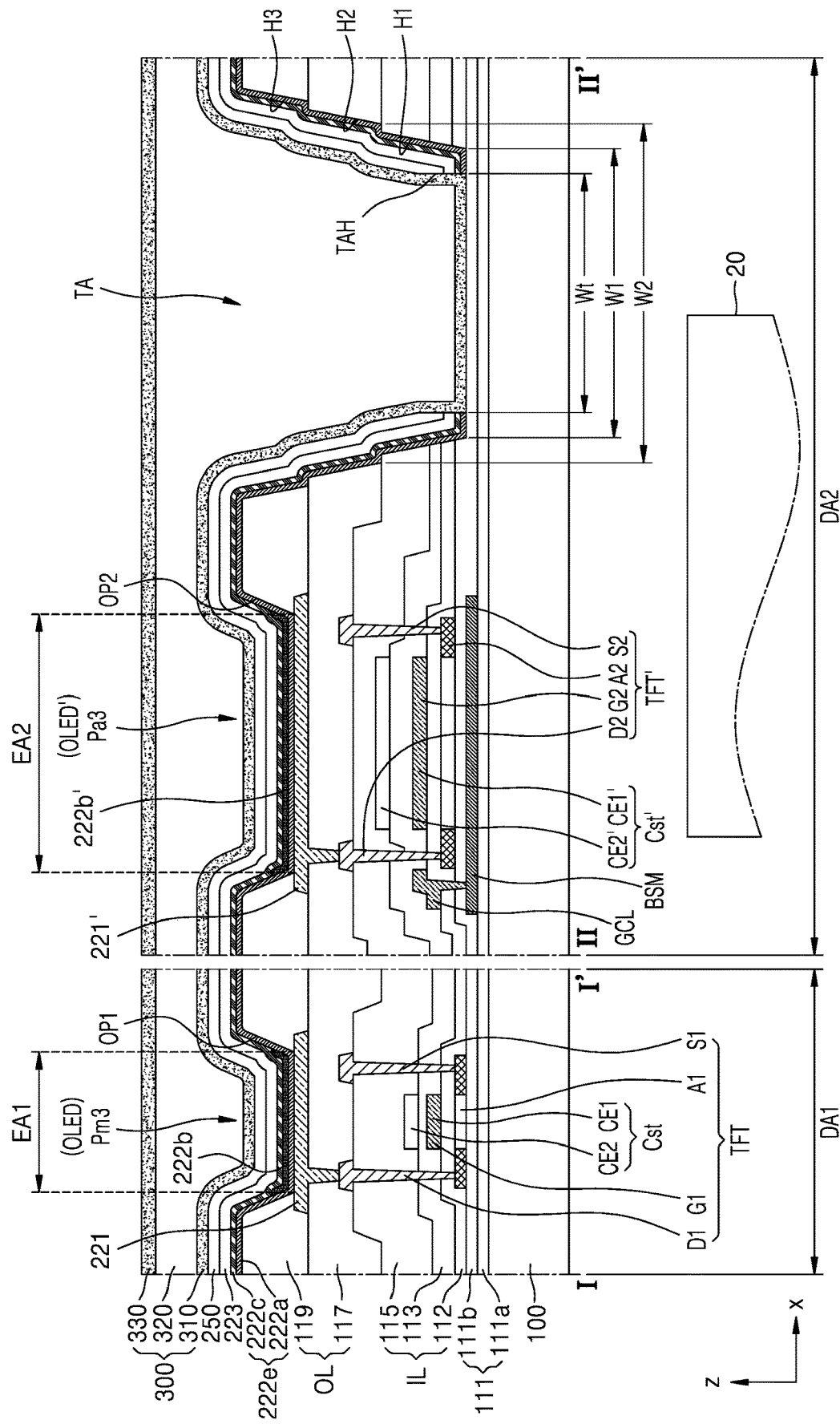
FIG. 6 is a schematic cross-sectional view of a display apparatus taken along the lines I-I' and II-II' of FIG. 5 according to an embodiment.

FIG. 5 is a schematic plan view of an arrangement of light-emission areas and transmission areas of subpixels arranged at (e.g., in or on) a first display area and a second display area. FIG. 6 is a schematic cross-sectional view of a display apparatus taken along the lines I-I' and II-II' of FIG. 5.

Referring to FIG. 5, in a display apparatus according to an embodiment, first, second, and third main subpixels Pm1, Pm2, and Pm3 are arranged at (e.g., in or on) a first display area DA1, and first, second, and third auxiliary subpixels Pa1, Pa2, and Pa3 and transmission portions TA are arranged at (e.g., in or on) a second display area DA2.

According to an embodiment, the first, second, and third main subpixels Pm1, Pm2, and Pm3 arranged at (e.g., in or on) the first display area DA1 may have different pixel layout structures from those of the first, second, and third auxiliary subpixels Pa1, Pa2, and Pa3 arranged at (e.g., in or on) the second display area DA2. As used in this specification, a pixel layout structure may be based on a light-emission area of each subpixel. The light-emission area of a subpixel may be defined by an opening of a pixel defining layer, which will be described in more detail below.

As shown in FIG. 5, the first, second, and third main subpixels Pm1, Pm2, and Pm3 may be arranged in a pentile structure at (e.g., in or on) the first display area DA1. The first main subpixel Pm1, the second main subpixel Pm2, and the third main subpixel Pm3 may represent different colors from each other. For example, the first main subpixel Pm1, the second main subpixel Pm2, and the third main subpixel Pm3 may represent a red color, a green color, and a blue color, respectively.

Accordingly, a plurality of first main subpixels Pm1 and a plurality of third main subpixels Pm3 may alternate with each other at (e.g., in or on) a first row 1N. A plurality of second main subpixels Pm2 may be spaced (e.g., by a predetermined distance) apart from each other at (e.g., in or on) a second row 2N adjacent to the first row 1N. A plurality of third main subpixels Pm3 and a plurality of first main subpixels Pm1 may alternate with each other at (e.g., in or on) a third row 3N adjacent to the second row 2N. A plurality of second main subpixels Pm2 may be spaced (e.g., by a predetermined distance) apart from each other at (e.g., in or on) a fourth row 4N adjacent to the third row 3N. In an embodiment, this pixel layout of the first to fourth rows 1N to 4N may be repeatedly arranged up to an N-th row (where N is a natural number). In this case, the third main subpixels Pm3 and the first main subpixels Pm1 may be larger than (e.g., may have a larger area than those of) the second main subpixels Pm2.

The plurality of first and third main subpixels Pm1 and Pm3 at (e.g., in or on) the first row 1N, and the plurality of second main subpixels Pm2 at (e.g., in or on) the second row 2N may have a zigzag arrangement with each other. Accordingly, the first main subpixels Pm1 and the third main subpixels Pm3 may alternate with each other at (e.g., in or on) a first column 1M, and a plurality of second main subpixels Pm2 may be spaced (e.g., by a predetermined distance) apart from each other at (e.g., in or on) a second column 2M adjacent to the first column 1M. Further, the third main subpixels Pm3 and the first main subpixels Pm1 may alternate with each other at (e.g., in or on) a third column 3M adjacent to the second column 2M, and a plurality of second main subpixels Pm2 may be spaced (e.g., by a predetermined distance) apart from each other at (e.g., in or on) a fourth column 4M adjacent to the third column 3M. In an embodiment, this pixel layout of the first to fourth columns 1M to 4M may be repeatedly arranged up to an M-th column (where M is a natural number).

In other words, the first main subpixels Pm1 may be arranged at first and third facing vertexes from among four vertexes of a virtual quadrilateral VS having a center point at a second main subpixel Pm2, and the third main subpixels Pm3 may be arranged at the other remaining vertexes, for example, second and fourth facing vertexes of the virtual quadrilateral VS. The virtual quadrilateral VS may have a rectangle shape, a rhombus shape, a square shape, or the like.

In this case, this pixel layout structure may be referred to as a pentile matrix. By applying rendering to the pentile matrix, in which a color of a pixel is expressed by sharing (e.g., combining) the colors of its adjacent pixels, a high resolution may be obtained via a small number of pixels.

The auxiliary subpixels Pa1, Pa2, and Pa3 may be arranged in an S-stripe shaped layout at (e.g., in or on) the second display area DA2. The first auxiliary subpixel Pa1, the second auxiliary subpixel Pa2, and the third auxiliary subpixel Pa3 may represent different colors from each other. For example, the first auxiliary subpixel Pa1, the second auxiliary subpixel Pa2, and the third auxiliary subpixel Pa3 may represent a red color, a green color, and a blue color, respectively.

In other words, first auxiliary subpixels Pa1 and second auxiliary subpixels Pa2 may alternate with each other at (e.g., in or on) a first column 1l, and third auxiliary subpixels Pa3 may be arranged at (e.g., in or on) a second column 2l adjacent to the first column 1l. One third auxiliary subpixel Pa3 may correspond to one first auxiliary subpixel Pa1 and one second auxiliary subpixel Pa2, and the third auxiliary subpixel Pa3 may be larger than (e.g., may have a larger area than those of) the first auxiliary subpixel Pa1 and the second auxiliary subpixel Pa2. In other words, the first auxiliary subpixels Pa1 and the second auxiliary subpixels Pa2 may each extend longer in the x-axis direction, and the third auxiliary subpixels Pa3 may each extend longer in a y-axis direction. Accordingly, a length of each of the third auxiliary subpixels Pa3 in the y-axis direction may be greater than or equal to a sum of a length of each of the first auxiliary subpixels Pa1 in the y-axis direction and a sum of a length of each of the second auxiliary subpixels Pa2 in the y-axis direction. In this case, this pixel layout may be referred to as an S-stripe layout.

A first auxiliary subpixel Pa1, a second auxiliary subpixel Pa2, and a third auxiliary subpixel Pa3 may form a single pixel group Pg. For example, as shown in FIG. 5, a single pixel group Pg may include three auxiliary subpixels, for example, one first auxiliary subpixel Pa1, one second auxiliary subpixel Pa2, and one third auxiliary subpixel Pa3. However, the present disclosure is not limited thereto, and the number and/or the layout of the auxiliary subpixels Pa1, Pa2, and Pa3 included in a single pixel group Pg may be variously modified.

A plurality of transmission portions TA may be arranged at (e.g., in or on) the second display area DA2. Each of the transmission portions TA may be an area having a high light transmittance, because no display elements may be arranged at (e.g., in or on) the transmission portions TA. The transmission portions TA may alternate with the pixel groups Pg in a first direction (e.g., the x-axis direction) and/or in a second direction (e.g., the y-axis direction). However, the present disclosure is not limited thereto, and in another embodiment, for example, the transmission portions TA may be arranged to surround (e.g., around a periphery of) a pixel group Pg.

At (e.g., in or on) the second display area DA2, a basic unit (e.g., a unit area) U, including a pixel group Pg and a transmission portion TA, may be repeatedly arranged in the x-axis direction and the y-axis direction.

The basic unit U illustrated in FIG. 5 may have a quadrilateral shape, and may include one pixel group Pg and a plurality of transmission portions TA that are arranged around (e.g., to partially surround around a periphery of) the pixel group Pg and are bounded together. The basic unit U may be a repetitive structure, and may not indicate a disconnected configuration. For example, the transmission portion TA included in a basic unit U may be integrally formed with the transmission portion TA included in an adjacent basic unit U.

According to an embodiment, in the basic unit U, the pixel group Pg may occupy an area less than (e.g., smaller than) that of the transmission portions TA. For example, the area of the pixel group Pg may be about ⅓ the area of the transmission portions TA. In other words, the area of the pixel group Pg may be about ¼ of the area of the basic unit U, and the area of the transmission portions TA may be about ¾ of the area of the basic unit U.

According to an embodiment, the auxiliary subpixels Pa1, Pa2, and Pa3 may have a different pixel layout structure from those of the main subpixels Pm1, Pm2, and Pm3, and the light-emission area of a third auxiliary subpixel Pa3 may be larger than that of a third main subpixel Pm3.

When the first, second, and third auxiliary subpixels Pa1, Pa2, and Pa3 have the same pixel layout structure as those of the first, second, and third main subpixels Pm1, Pm2, and Pm3, and the same current is applied to the first, second, and third auxiliary subpixels Pa1, Pa2, and Pa3 and the first, second, and third main subpixels Pm1, Pm2, and Pm3, brightness of the second display area DA2 may be reduced. When more current is applied to the first, second, and third auxiliary subpixels Pa1, Pa2, and Pa3 than to the first, second, and third main subpixels Pm1, Pm2, and Pm3 to compensate for the brightness of the second display area DA2, the first, second, and third auxiliary subpixels Pa1, Pa2, and Pa3 may be degraded (e.g., may be easily degraded).

According to an embodiment, the first, second, and third auxiliary subpixels Pa1, Pa2, and Pa3 may have larger light-emission areas than those of the first, second, and third main subpixels Pm1, Pm2, and Pm3, respectively. In this case, by employing a pixel layout structure where the first, second, and third auxiliary subpixels Pa1, Pa2, and Pa3 having the larger light-emission areas are included in the second display area DA2, the first, second, and third auxiliary subpixels Pa1, Pa2, and Pa3 may be prevented or substantially prevented from being degraded, and thus, the second display area DA2 may provide the same or substantially the same level of brightness as that of the first display area DA1.

According to an embodiment, the third auxiliary subpixels Pa3 representing the same or substantially the same color as that of the third main subpixels Pm3 may include larger light-emission areas than those of the third main subpixels Pm3. For example, the light-emission area of each of the third auxiliary subpixels Pa3 may be four to eight times that of each of the third main subpixels Pm3. In this case, the third auxiliary subpixels Pa3 and the third main subpixels Pm3 may emit blue light. Because organic light-emitting diodes that emit blue light may be more prone to deterioration than organic light-emitting diodes that emit other colors, the light-emission areas of pixels emitting blue light may have the largest area.

Similarly, the first auxiliary subpixels Pa1 representing the same or substantially the same color as that of the first main subpixels Pm1 may include larger light-emission areas than those of the first main subpixels Pm1, and the second auxiliary subpixels Pa2 representing the same or substantially the same color as that of the second main subpixels Pm2 may include larger light-emission areas than those of the second main subpixels Pm2. Sizes of the light-emission areas of each first auxiliary subpixel Pa1 and each second auxiliary subpixel Pa2 may be two to six times those of the light-emission areas of each first main subpixel Pm1 and each second main subpixel Pm2, respectively.

At (e.g., in or on) the first display area DA1, corresponding units (e.g., corresponding unit areas) U', each having the same or substantially the same area (e.g., the same size) as that of each basic unit U, may be arranged (e.g., may be set). In this case, the number of main subpixels Pm1, Pm2, and Pm3 that are included in each corresponding unit U' may be greater than the number of auxiliary subpixels Pa1, Pa2, and Pa3 that are included in each basic unit U.

However, an overall light-emitting area of the auxiliary subpixels Pa1, Pa2, and Pa3 included in each basic unit U may be 0.5 to 1 times that of the main subpixels Pm1, Pm2, and Pm3 included in each corresponding unit U'. In other words, when the number of auxiliary subpixels Pa1, Pa2, and Pa3 included in each basic unit U is three, and the number of main subpixels Pm1, Pm2, and Pm3 included in each corresponding unit U' is 32, a sum of the light-emitting areas of the three auxiliary subpixels Pa1, Pa2, and Pa3 may be 0.5 to 1 times that of the light-emitting areas of the 32 main subpixels Pm1, Pm2, and Pm3.

The respective light-emitting areas of the auxiliary subpixels Pa1, Pa2, and Pa3 may be determined (e.g., may be set) in consideration of the sum of the respective light-emitting areas of the main subpixels Pm1, Pm2, and Pm3 included in each corresponding unit U'.

Referring to FIG. 6, which illustrates cross-sections of the display panel 10 taken along the lines I-I' and II-II' of FIG. 5, the display apparatus according to an embodiment includes the first display area DA1 and the second display area DA2. A third main subpixel Pm3 may be arranged at (e.g., in or on) the first display area DA1. A third auxiliary subpixel Pa3 and a transmission portion TA may be arranged at (e.g., in or on) the second display area DA2. In this case, the third main subpixel Pm3 and the third auxiliary subpixel Pa3 may be subpixels representing the same or substantially the same color as each other. For example, according to an embodiment, the third main subpixel Pm3 and the third auxiliary subpixel Pa3 may each realize a blue color.

Each main subpixel Pm may include a first thin-film transistor TFT, a main storage capacitor Cst, and a main organic light-emitting diode OLED. Each auxiliary subpixel Pa may include a second thin-film transistor TFT', an auxiliary storage capacitor Cst', and an auxiliary organic light-emitting diode OLED'. The transmission portion TA may include an opening area TAH to correspond to a transmission area of the transmission portion TA.

Underneath the second display area DA2 (e.g., underneath the substrate 100 at (e.g., in or on) the second display area DA2), the component 20 may be arranged. The component 20 may include (e.g., may be) a camera that captures an image, and/or an infrared (IR) sensor that transmits/receives IR light. Because the transmission portion TA is arranged at (e.g., in or on) the second display area DA2, the transmission portion TA may transmit light therethrough that is transmitted/received to/from the component 20. For example, light emitted from the component 20 may travel via (e.g., travel through) the transmission portion TA in a z-axis direction, and light generated at the outside of the display apparatus and incident upon the component 20 may travel via (e.g., travel through) the transmission portion TA in a direction opposite to the z-axis direction (e.g., in a −z-axis direction). According to an embodiment, the component 20 may include a plurality of image sensors, and in this case, one image sensor may be arranged to correspond to one transmission portion TA.

A structure in which the elements, layers, and/or components included in the display apparatus are stacked according to an embodiment will now be described.

The substrate 100 may include glass or polymer resin. Examples of the polymer resin may include polyethersulphone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may have flexible, rollable, and/or bendable characteristics. The substrate 100 may have a multi-layered structure including a layer including one or more of the aforementioned polymer resins, and an inorganic layer.

A buffer layer 111 may be positioned on the substrate 100, and may provide a flat or substantially flat surface on the substrate 100. The buffer layer 111 may reduce or prevent infiltration of a foreign material, moisture, and/or ambient air from below the substrate 100. The buffer layer 111 may include an inorganic material (e.g., such as an oxide or a nitride), an organic material, or an organic and inorganic compound, and may be formed as a single layer or multiple layers including one or more of an inorganic material and an organic material. In an embodiment, a barrier layer may be further arranged between the substrate 100 and the buffer layer 111 to prevent or substantially prevent infiltration of ambient air. According to an embodiment, the buffer layer 111 may include silicon oxide ($SiO_2$) or silicon nitride ($SiN_x$). The buffer layer 111 may include a first buffer layer 111a and a second buffer layer 111b that are stacked on one another.

A lower electrode layer BSM may be between the first buffer layer 111a and the second buffer layer 111b at (e.g., in or on) the second display area DA2. According to another embodiment, the lower electrode layer BSM may be between the substrate 100 and the first buffer layer 111a at (e.g., in or on) the second display area DA2. The lower electrode layer BSM may be located below (e.g., underneath) the second thin-film transistor TFT', and may prevent or substantially prevent characteristics of the second thin-film transistor TFT' from degrading due to light emitted from, for example, the component 20.

The lower electrode layer BSM may be connected to a wire GCL via a contact hole, the wire GCL being arranged at (e.g., in or on) a different layer from that of the lower electrode layer BSM. The lower electrode layer BSM may receive a static voltage or a signal from the wire GCL. For example, the lower electrode layer BSM may receive a driving voltage ELVDD or a scan signal from the wire GCL. As the lower electrode layer BSM receives a static voltage or a signal, the probability that an electrostatic discharge may occur may be reduced or significantly reduced. The lower electrode layer BSM may include, for example, aluminum (Al), platinum (Pt), palladium (Pd), silver (Ag), magnesium (Mg), gold (Au), nickel (Ni), neodymium (Nd), iridium (Ir), chromium (Cr), molybdenum (Mo), titanium (Ti), tungsten (W), and/or copper (Cu). The lower electrode layer BSM may be a single layer or multi-layers including one or more of the aforementioned materials.

The first thin-film transistor TFT and/or the second thin-film transistor TFT' may be arranged on the buffer layer 111. The first thin-film transistor TFT includes a first semiconductor layer A1, a first gate electrode G1, a first source electrode S1, and a first drain electrode D1. The second thin-film transistor TFT' includes a second semiconductor layer A2, a second gate electrode G2, a second source electrode S2, and a second drain electrode D2. The first thin-film transistor TFT may be connected to the main organic light-emitting diode OLED of the first display area DA1, and may drive the main organic light-emitting diode OLED. The second thin-film transistor TFT' may be connected to the auxiliary organic light-emitting diode OLED' of the second display area DA2, and may drive the auxiliary organic light-emitting diode OLED'.

The first semiconductor layer A1 and the second semiconductor layer A2 may be on the buffer layer 111, and may include polysilicon. According to another embodiment, the first semiconductor layer A1 and the second semiconductor layer A2 may include amorphous silicon. According to another embodiment, the first and second semiconductor layers A1 and A2 may include an oxide of at least one selected from the group consisting of indium (In), gallium (Ga), tin (Sn), zirconium (Zr), vanadium (V), hafnium (Hf), cadmium (Cd), germanium (Ge), chromium (Cr), titanium (Ti), and zinc (Zn). The first and second semiconductor layers A1 and A2 may include a channel region, a source region, and a drain region. The source region and the drain region may be doped with impurities.

The first semiconductor layer A1 may overlap with the lower electrode layer BSM with the second buffer layer 111b therebetween. According to an embodiment, a width (e.g., in the x-axis direction) of the first semiconductor layer A1 may be less than a width (e.g., in the x-axis direction) of the lower electrode layer BSM. Accordingly, when projection is performed in a direction perpendicular to or substantially perpendicular to the substrate 100 (e.g., when viewed in a plan view), an entirety of the first semiconductor layer A1 may overlap with the lower electrode layer BSM.

A first gate insulating layer 112 may cover the first and second semiconductor layers A1 and A2. The first gate insulating layer 112 may include an inorganic insulating material, for example, such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The first gate insulating layer 112 may be a single layer or multi-layers including one or more of the aforementioned inorganic insulating materials.

The first gate electrode G1 and the second gate electrode G2 are located on (e.g., located over) the first gate insulating layer 112, and overlap with the first semiconductor layer A1 and the second semiconductor layer A2, respectively. The first and second gate electrodes G1 and G2 may include, for example, molybdenum (Mo), aluminum (Al), copper (Cu), and/or titanium (Ti), and may each be a single layer or multiple layers. For example, each of the first and second gate electrodes G1 and G2 may be a single layer of Mo.

A second gate insulating layer 113 may cover the first gate electrode G1 and the second gate electrode G2. The second gate insulating layer 113 may include an inorganic insulating material, for example, such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). The second gate insulating layer 113 may be a single layer or multi-layers including one or more of the aforementioned inorganic insulating materials.

A first upper electrode CE2 of the main storage capacitor Cst and a second upper electrode CE2' of the auxiliary storage capacitor Cst' may be on the second gate insulating layer 113.

The first upper electrode CE2 may overlap with the first gate electrode G1 at (e.g., in or on) the first display area DA1 with the second gate insulating layer 113 therebetween. The first gate electrode G1, the first upper electrode CE2, and the second gate insulating layer 113 therebetween may define (e.g., may form or may constitute) the main storage capacitor Cst. In this case, the first gate electrode G1 may serve as (e.g., may be) the first lower electrode CE1 of the main storage capacitor Cst.

The second upper electrode CE2' may overlap with the second gate electrode G2 at (e.g., in or on) the second display area DA2 with the second gate insulating layer 113 therebetween. The second gate electrode G2, the second upper electrode CE2', and the second gate insulating layer 113 therebetween may define (e.g., may form or may constitute) the auxiliary storage capacitor Cst'. In this case, the second gate electrode G2 may serve as (e.g., may be) the second lower electrode CE1' of the auxiliary storage capacitor Cst'.

The first and second upper electrodes CE2 and CE2' may include, for example, aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may each be a single layer or multi-layers including one or more of the aforementioned materials.

An interlayer insulating layer 115 may cover the first upper electrode CE2 and the second upper electrode CE2'. The interlayer insulating layer 115 may include, for example, $SiO_2$, $SiN_X$, SiON, $Al_2O_3$, $TiO_2$, $Ta_2O_5$, $HfO_2$, $ZnO_2$, and/or the like.

The first gate insulating layer 112, the second gate insulating layer 113, and the interlayer insulating layer 115 may be collectively referred to as an inorganic insulating layer IL, and in this case, a structure in which the inorganic insulating layer IL is stacked on the substrate 100 may have a transmittance of about 90% or more with respect to an infrared wavelength. For example, light in a wavelength of 900 nm to 1100 nm may pass through the substrate 100, such that the inorganic insulating layer IL may have a transmittance of about 90%.

The first and second source electrodes S1 and S2 and the first and second drain electrodes D1 and D2 are arranged on the interlayer insulating layer 115. Each of the first and second source electrodes S1 and S2 and the first and second drain electrodes D1 and D2 may include a conductive material including, for example, Mo, Al, Cu, and/or Ti, and may be a single layer or multi-layers including one or more of the aforementioned materials. For example, in an embodiment, each of the first and second source electrodes S1 and S2 and the first and second drain electrodes D1 and D2 may be formed as multi-layers of Ti/Al/Ti.

A planarization layer 117 may be located to cover the first and second source electrodes S1 and S2 and the first and second drain electrodes D1 and D2. The planarization layer 117 may have a flat or substantially flat upper surface such that a first pixel electrode 221 and a second pixel electrode 221' that are located thereon may be formed to be flat or substantially flat.

The planarization layer 117 may be a single layer including an organic material, or multi-layers formed by stacking various single layers including an organic material. The planarization layer 117 may include a commercial polymer, for example, such as benzocyclobutene (BCB), polyimide, hexamethyldisiloxane (HMDSO), polymethyl methacrylate (PMMA), and/or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, and/or the like, or a combination (a blend thereof).

An opening exposing one of the first source electrode S1 and the first drain electrode D1 of the first thin-film-transistor TFT may be formed in the planarization layer 117, and the first pixel electrode 221 may contact the first source electrode S1 or the first drain electrode D1 via the opening to be electrically connected to the first thin-film-transistor TFT.

Another opening exposing one of the second source electrode S2 and the second drain electrode D2 of the second thin-film-transistor TFT' may be formed in the planarization layer 117, and the second pixel electrode 221' may contact the second source electrode S2 or the second drain electrode D2 via the opening to be electrically connected to the second thin-film-transistor TFT'.

The first and second pixel electrodes 221 and 221' may include a conductive oxide, for example, such as indium tin oxide (ITO), indium zinc oxide (IZO), zinc oxide (ZnO), indium oxide ($In_2O_3$), indium gallium oxide (IGO), and/or aluminum zinc oxide (AZO). According to another embodiment, the first and second pixel electrodes 221 and 221' may include a reflection layer including, for example, silver (Ag), magnesium (Mg), aluminum (Al), platinum (Pt), palladium (Pd), gold (Au), nickel (Ni), neodymium (Nd), iridium (Ir), chromium (Cr), or a mixture (e.g., a compound) of these materials. According to another embodiment, the first and second pixel electrodes 221 and 221' may further include a film formed of ITO, IZO, ZnO, and/or $In_2O_3$, and the film may be above/below the aforementioned reflection layer. According to an embodiment, each of the first and second pixel electrodes 221 and 221' may have a stack structure of ITO/Ag/ITO.

A pixel defining layer 119 may cover edges (e.g., opposite edges) of each of the first pixel electrode 221 and the second pixel electrode 221'. The pixel defining layer 119 overlaps with the first pixel electrode 221 and the second pixel electrode 221', and includes a first opening OP1 and a second opening OP2 that define the light-emission areas of the subpixels. The pixel defining layer 119 may prevent or substantially prevent an electric arc and/or the like from occurring at (e.g., in or on) the edges of the first and second pixel electrodes 221 and 221' by increasing distances between the edges of the first and second pixel electrodes 221 and 221' and portions of an opposite electrode 223 on the first and second pixel electrodes 221 and 221'. The pixel defining layer 119 may be formed of an organic insulating material, for example, such as polyimide, polyamide, acryl resin, benzocyclobutene, hexamethyldisiloxane (HMDSO), or phenol resin, via spin coating and/or the like.

The planarization layer 117 and the pixel defining layer 119 may be collectively referred to as an organic insulating layer OL, and in this case, the organic insulating layer OL may have a transmittance of about 90% or more with respect to an infrared wavelength. For example, light in a wavelength of 900 nm to 1100 nm may pass through the organic insulating layer OL, such that the organic insulating layer OL may have a transmittance of about 90%.

A first emission layer 222b and a second emission layer 222b' may be arranged within the first opening OP1 and the second opening OP2 of the pixel defining layer 119 to correspond to the first pixel electrode 221 and the second pixel electrode 221', respectively. The first emission layer 222b and the second emission layer 222b' may include a high molecular weight material or a low molecular weight material, and may emit a red light, a green light, a blue light, or a white light.

An organic functional layer 222e may be above and/or below the first emission layer 222b and the second emission layer 222b'. The organic functional layer 222e may include a first functional layer 222a and/or a second functional layer 222c. However, the present disclosure is not limited thereto, and the first functional layer 222a or the second functional layer 222c may be omitted.

The first functional layer 222a may be below (e.g., underneath) the first emission layer 222b and the second emission layer 222b'. The first functional layer 222a may be a single layer or multiple layers including an organic material. The first functional layer 222a may include (e.g., may be) a hole transport layer (HTL) that is a single layer. In another embodiment, the first functional layer 222a may include a hole injection layer (HIL) and an HTL. The first functional layer 222a may be integrally formed to correspond to the main subpixels Pm and the auxiliary subpixels Pa included at (e.g., in or on) the first display area DA1 and the second display area DA2. Accordingly, the first functional layer 222a may be arranged to correspond to the transmission portion TA.

The second functional layer 222c may be on (e.g., may be above) the first emission layer 222b and the second emission layer 222b'. The second functional layer 222c may be a single layer or multiple layers including an organic material. The second functional layer 222c may include an electron transport layer (ETL) and/or an electron injection layer (EIL). The second functional layer 222c may be integrally formed to correspond to the main subpixels Pm and the auxiliary subpixels Pa included at (e.g., in or on) the first display area DA1 and the second display area DA2. Accordingly, the second functional layer 222c may be arranged to correspond to the transmission portion TA.

The opposite electrode 223 may be arranged on the second functional layer 222c. The opposite electrode 223 may include a conductive material having a low work function. For example, the opposite electrode 223 may include a (semi)transparent layer including, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture (e.g., an alloy) of these materials. In another embodiment, the opposite electrode 223 may further include a layer, for example, such as ITO, IZO, ZnO, or $In_2O_3$, on the (semi)transparent layer including one or more of the above-described materials. The opposite electrode 223 may be integrally formed to correspond to the main subpixels Pm and the auxiliary subpixels Pa included at (e.g., in or on) the first display area DA1 and the second display area DA2.

The layers ranging from the first pixel electrode 221 to the opposite electrode 223 arranged at (e.g., in or on) the first display area DA1 may define (e.g., may form or may constitute) the main organic light-emitting diode OLED. The layers ranging from the second pixel electrode 221' to the opposite electrode 223 arranged at (e.g., in or on) the second display area DA2 may define (e.g., may form or may constitute) the auxiliary organic light-emitting diode OLED'.

An upper layer 250 including an organic material may be on the opposite electrode 223. The upper layer 250 may be provided to protect the opposite electrode 223, and may also increase a light extraction efficiency. The upper layer 250 may include an organic material having a higher refractive index than that of the opposite electrode 223. In another embodiment, the upper layer 250 may include a stack of layers having different refractive indexes from each other. For example, the upper layer 250 may be provided by stacking a high refractive index layer, a low refractive index layer, and a high refractive index layer in this stated order. In this case, the high refractive index layer may have a refractive index of 1.7 or more, and the low refractive index layer may have a refractive index of 1.3 or more.

In an embodiment, the upper layer 250 may additionally include lithium fluoride (LiF). In another embodiment, the upper layer 250 may include an inorganic insulating material, for example, such as silicon oxide ($SiO_2$) or silicon nitride ($SiN_x$).

According to an embodiment, as shown in FIG. 6, the first functional layer 222a, the second functional layer 222c, the opposite electrode 223, and the upper layer 250 may include an opening area TAH corresponding to the transmission portion TA. In other words, the first functional layer 222a, the second functional layer 222c, the opposite electrode 223, and the upper layer 250 may include openings corresponding to the transmission portion TA, respectively. The openings of the first functional layer 222a, the second functional layer 222c, the opposite electrode 223, and the upper layer 250 may be formed by a laser. According to an embodiment, the openings that form the opening area TAH may have the same or substantially the same widths (e.g., in the x-axis direction) as each other. For example, the width of the opening of the opposite electrode 223 may be the same or substantially the same as that of the opening area TAH.

According to an embodiment, the first functional layer 222a, the second functional layer 222c, and the upper layer 250 may be omitted. In this case, the opening of the opposite electrode 223 may define (e.g., may be) the opening area TAH.

The opening area TAH corresponding to the transmission portion TA may refer to the opening area TAH overlapping with the transmission portion TA. In this case, the opening area TAH may have a smaller area than a first hole H1 formed in the inorganic insulating layer IL. For example, FIG. 6 illustrates that a width Wt of the opening area TAH is less than a width W1 of the first hole H1. The opening area TAH and the first hole H1 may have the smallest areas when compared to other holes (e.g., H2 and H3) at the opening area TAH.

According to an embodiment, the first functional layer 222a, the second functional layer 222c, the opposite electrode 223, and the upper layer 250 may be located on lateral surfaces of the first hole H1, a second hole H2, and a third hole H3. According to an embodiment, inclinations of the lateral surfaces of the first hole H1, the second hole H2, and the third hole H3 with respect to the upper surface of the substrate 100 may be more gentle than an inclination of the lateral surface of the opening area TAH with respect to the upper surface of the substrate 100.

Because the opening area TAH may be formed such that a member, for example, such as the opposite electrode 223, is removed from the transmission portion TA, the light transmittance in the transmission portion TA may increase or significantly increase.

The main organic light-emitting diode OLED and the auxiliary organic light-emitting diode OLED' may be sealed by the thin-film encapsulation layer 300. The thin-film encapsulation layer 300 may be located on the upper layer 250. The thin-film encapsulation layer 300 may prevent or reduce infiltration of external moisture and/or foreign materials into the main organic light-emitting diode OLED and the auxiliary organic light-emitting diode OLED'.

The thin-film encapsulation layer 300 may include at least one inorganic encapsulation layer, and at least one organic encapsulation layer. For example, FIG. 6 illustrates that the thin-film encapsulation layer 300 includes a first inorganic encapsulation layer 310, an organic encapsulation layer 320, and a second inorganic encapsulation layer 330. However, the present disclosure is not limited thereto, and according to another embodiment, the number of organic encapsulation layers, the number of inorganic encapsulation layers, and/or the stacking order of the organic encapsulation layers and the inorganic encapsulation layers may be variously modified.

The first and second inorganic encapsulation layers 310 and 330 may include at least one inorganic insulating material, for example, such as aluminum oxide, titanium oxide, tantalum oxide, hafnium oxide, zinc oxide, silicon oxide, silicon nitride, and/or silicon oxynitride, and may be formed via chemical vapor deposition (CVD) and/or the like. The organic encapsulation layer 320 may include a polymer-based material. Examples of the polymer-based material may include a silicon-based resin, an acrylic resin, an epoxy-based resin, polyimide, and polyethylene.

The first inorganic encapsulation layer 310, the organic encapsulation layer 320, and the second inorganic encapsulation layer 330 may each be integrally formed to cover the first display area DA1 and the second display area DA2. Accordingly, the first inorganic encapsulation layer 310, the organic encapsulation layer 320, and the second inorganic encapsulation layer 330 may be arranged within the opening area TAH.

According to another embodiment, the organic encapsulation layer 320 may be integrally formed to cover the first display area DA1 and the second display area DA2, but may be omitted from (e.g., may not exist in) the transmission portion TA. In other words, the organic encapsulation layer 320 may include an opening corresponding to the transmission portion TA. In this case, the first inorganic encapsulation layer 310 and the second inorganic encapsulation layer 330 may contact each other at (e.g., within) the transmission hole TAH.

According to an embodiment, the second opening OP2 defining a light-emission area EA2 of the third auxiliary subpixel Pa3 may have a larger size than that of the first opening OP1 defining a light-emission area EA1 of the third main subpixel Pm3. Accordingly, when the third auxiliary subpixel Pa3 and the third main subpixel Pm3 receive the same or substantially the same current, the third auxiliary subpixels Pa3 may provide a greater brightness than that of the third main subpixel Pm3.

Because less auxiliary subpixels are arranged for each basic unit U within the second display area DA2 than the main subpixels arranged for each corresponding unit U' within the first display area DA1, a brightness that is realized by the corresponding unit U' of the first display area DA1 may be equal to or substantially equal to a brightness that is realized by the basic unit U of the second display area DA2.

Figure 7:
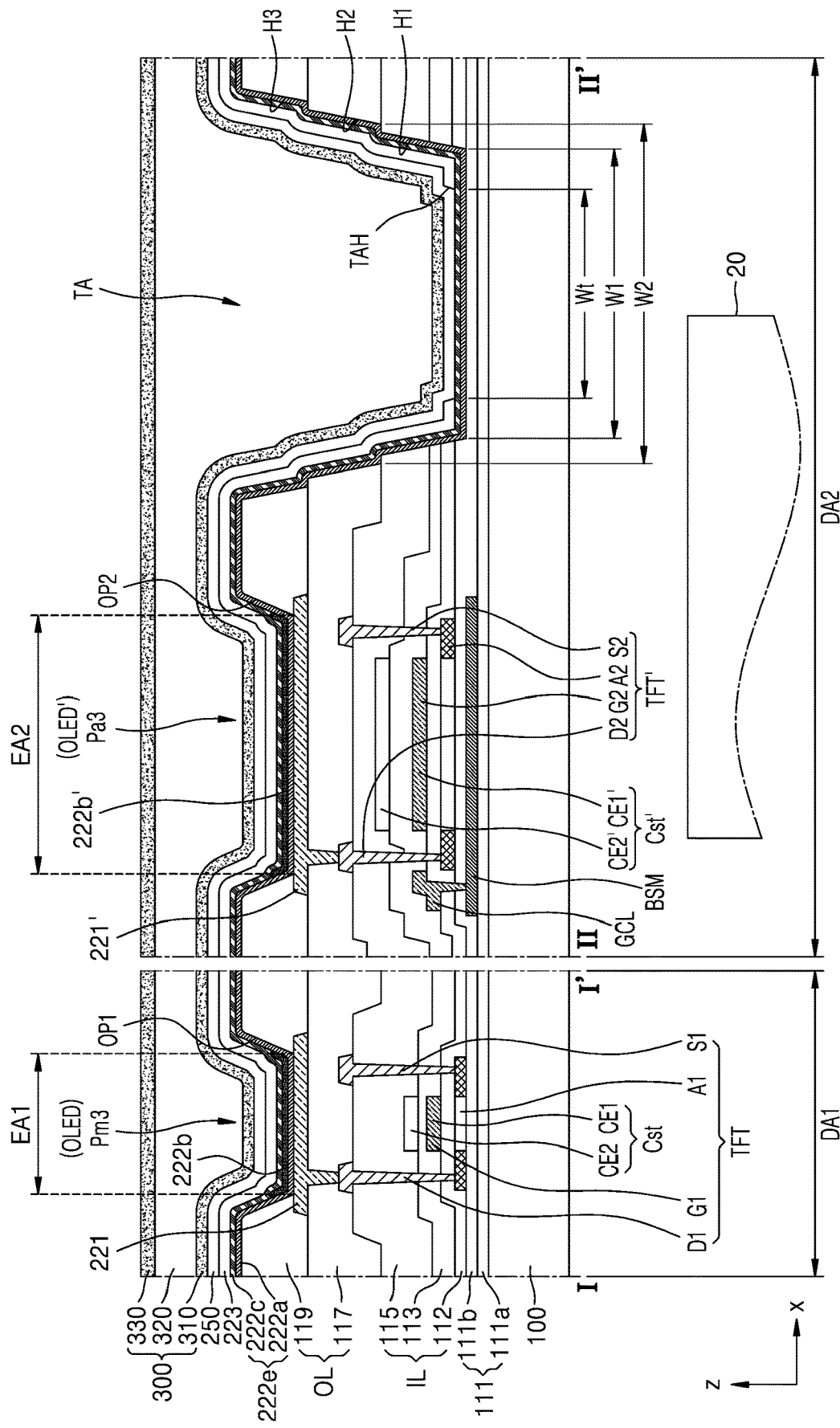
FIG. 7 is a schematic cross-sectional view of a display apparatus taken along the lines I-I' and II-II' of FIG. 5 according to another embodiment.

FIG. 7 is a schematic cross-sectional view of a display apparatus taken along the lines I-I' and II-II' of FIG. 5 according to another embodiment. The same reference symbols from FIG. 6 are used to denote the same or substantially the same elements in FIG. 7, and thus, redundant descriptions thereof may not be repeated.

Referring to FIG. 7, the display apparatus includes the first display area DA1 at (e.g., in or on) which a main subpixel Pm is arranged, and the second display area DA2 at (e.g., in or on) which an auxiliary subpixel Pa and a transmission portion TA are arranged. A light-emission area EA2 of the auxiliary subpixel Pa may be larger than a light-emission area EA1 of the main subpixel Pm. In the display apparatus according to an embodiment, a pixel layout of the main subpixels Pm may be different from that of the auxiliary subpixels Pa.

According to an embodiment, at least one of the first functional layer 222a, the second functional layer 222c, and the upper layer 250 may be arranged (e.g., may extend) to correspond to the transmission portion TA. In other words, at least one of the first functional layer 222a, the second functional layer 222c, and the upper layer 250 may be arranged within the opening area TAH.

The opposite electrode 223 may include an opening corresponding to the transmission portion TA, and the width (e.g., in the x-axis direction) of the opening of the opposite electrode 223 may be the same or substantially the same as that of the opening area TAH. In this case, the opposite electrode 223 may be formed using a mask including, for example, a shielding film that shields the transmission portion TA.

Figure 8:
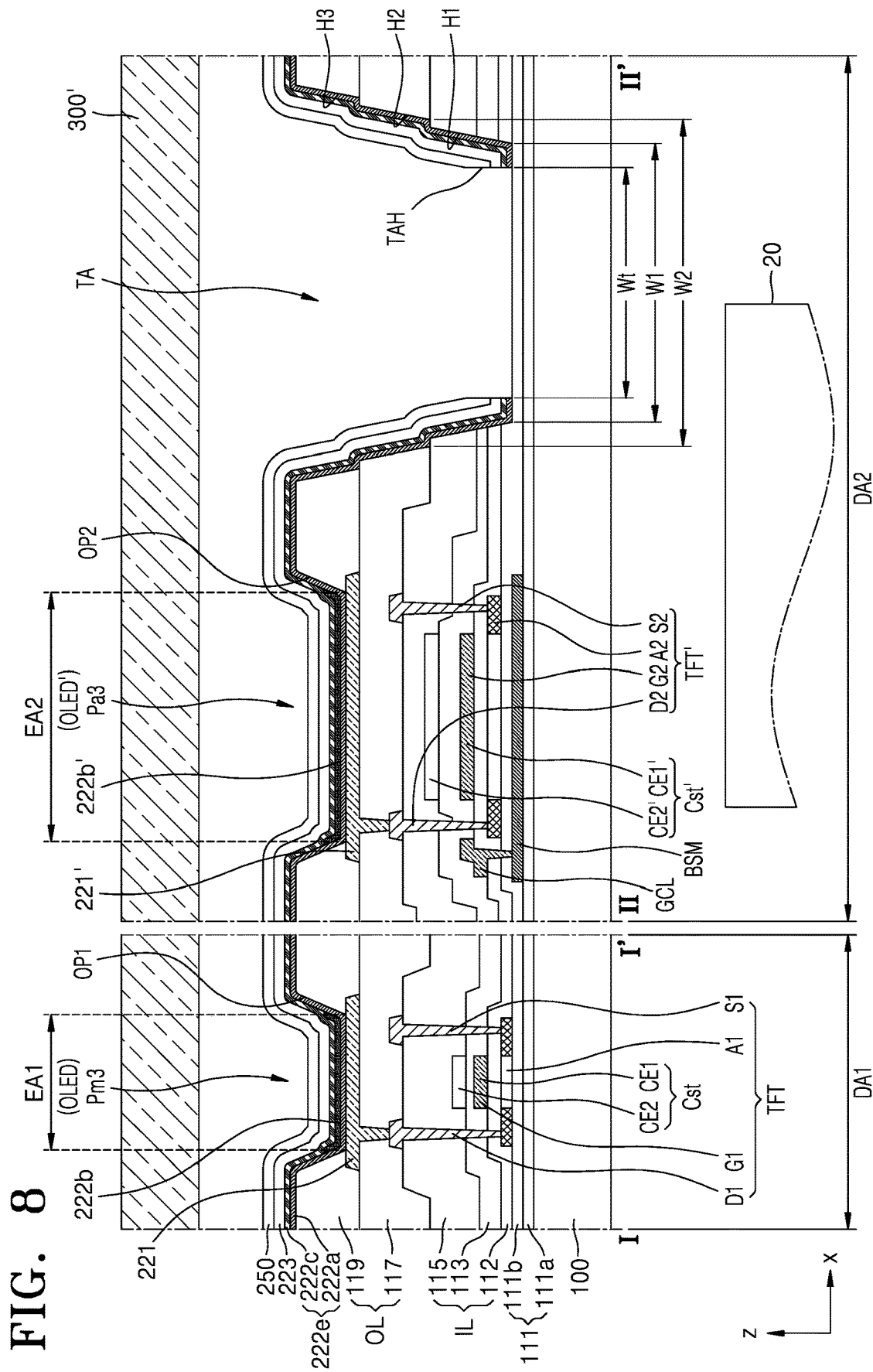
FIG. 8 is a schematic cross-sectional view of a display apparatus taken along the lines I-I' and II-II' of FIG. 5 according to another embodiment.

FIG. 8 is a schematic cross-sectional view of a display apparatus taken along the lines I-I' and II-II' of FIG. 5 according to another embodiment. The same reference symbols from FIG. 6 are used to denote the same or substantially the same elements in FIG. 8, and thus, redundant descriptions thereof may not be repeated.

Referring to FIG. 8, the display apparatus includes the first display area DA1 at (e.g., in or on) which a main subpixel Pm is arranged, and the second display area DA2 at (e.g., in or on) which an auxiliary subpixel Pa and a transmission portion TA are arranged. A light-emission area EA2 of the auxiliary subpixel Pa may be larger than a light-emission area EA1 of the main subpixel Pm. In the display apparatus according to an embodiment, a pixel layout of the main subpixels Pm may be different from that of auxiliary subpixels Pa.

According to an embodiment, the main organic light-emitting diode OLED and the auxiliary organic light-emitting diode OLED' may be covered by an encapsulation substrate 300'. The encapsulation substrate 300' includes a transparent material. For example, the encapsulation substrate 300' may include a glass material. In another embodiment, the encapsulation substrate 300' may include, for example, a polymer resin. The encapsulation substrate 300' may prevent or substantially prevent infiltration of external moisture and/or foreign materials into the main organic light-emitting diode OLED and the auxiliary organic light-emitting diode OLED'.

A sealing material, for example, such as a sealant, may be arranged between the substrate 100, including the main organic light-emitting diode OLED and the auxiliary organic light-emitting diode OLED' formed thereon, and the encapsulation substrate 300'. The sealing material may block or substantially block external moisture and/or foreign materials that may permeate between the substrate 100 and the encapsulation substrate 300'.

FIGS. 9 through 12 are schematic plan views illustrating various pixel layouts according to one or more other embodiments. The same reference symbols from FIG. 5 are used to denote the same or substantially the same elements in FIGS. 9 through 12, and thus, redundant descriptions thereof may not be repeated.

Figure 9:
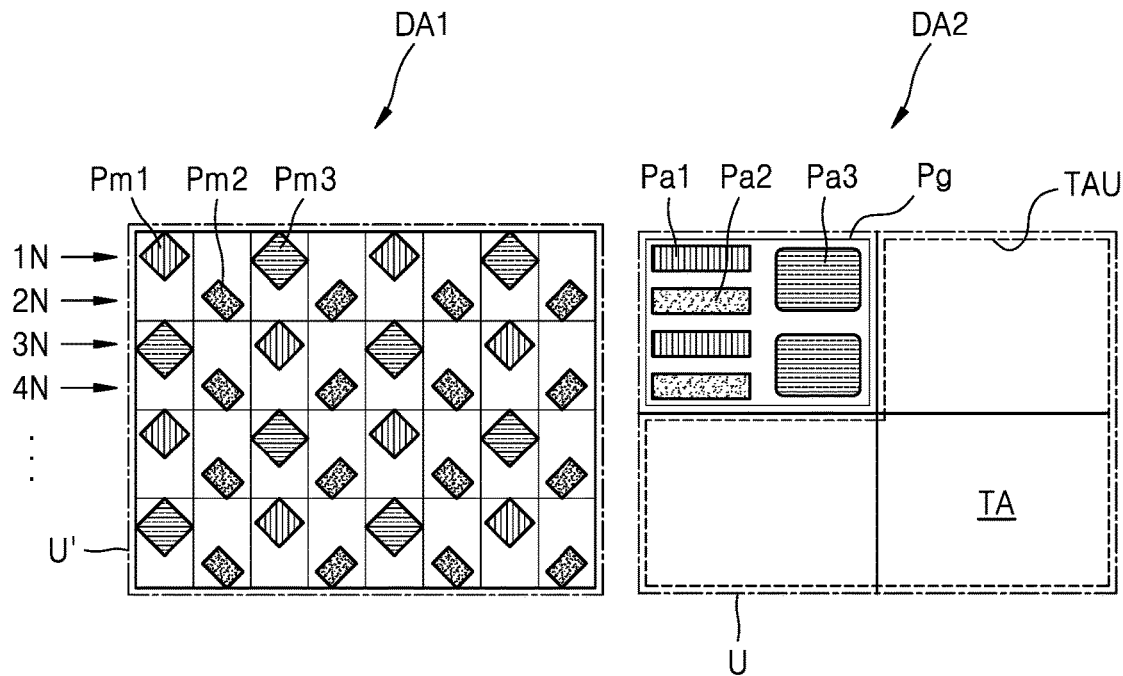
FIG. 9 is a schematic plan view illustrating an arrangement of subpixels and transmission portions in a first display area and a second display area according to another embodiment.

Referring to FIG. 9, the first, second, and third main subpixels Pm1, Pm2, and Pm3 arranged at (e.g., in or on) the first display area DA1 may have different pixel layout structures from those of the first, second, and third auxiliary subpixels Pa1, Pa2, and Pa3 arranged at (e.g., in or on) the second display area DA2. The light-emission area of the third auxiliary subpixel Pa3 may be larger than that of the third main subpixel Pm3, which may represent the same or substantially the same color as that of the third auxiliary subpixel Pa3. For example, according to an embodiment, the third auxiliary subpixel Pa3 and the third main subpixel Pm3 may emit a blue light.

According to an embodiment, the first, second, and third auxiliary subpixels Pa1, Pa2, and Pa3 included in the basic unit U may be arranged in an S-stripe structure, and six first, second, and third auxiliary subpixels Pa1, Pa2, and Pa3 may be arranged in one pixel group Pg.

According to an embodiment, the light-emission area of the first auxiliary subpixel Pa1 may be larger than that of the first main subpixel Pm1, which may represent the or substantially the same color as that of the first auxiliary subpixel Pa1.

According to an embodiment, the light-emission area of the second auxiliary subpixel Pa2 may be larger than that of the second main subpixel Pm2, which may represent the same or substantially the same color as that of the second auxiliary subpixel Pa2.

Figure 10:
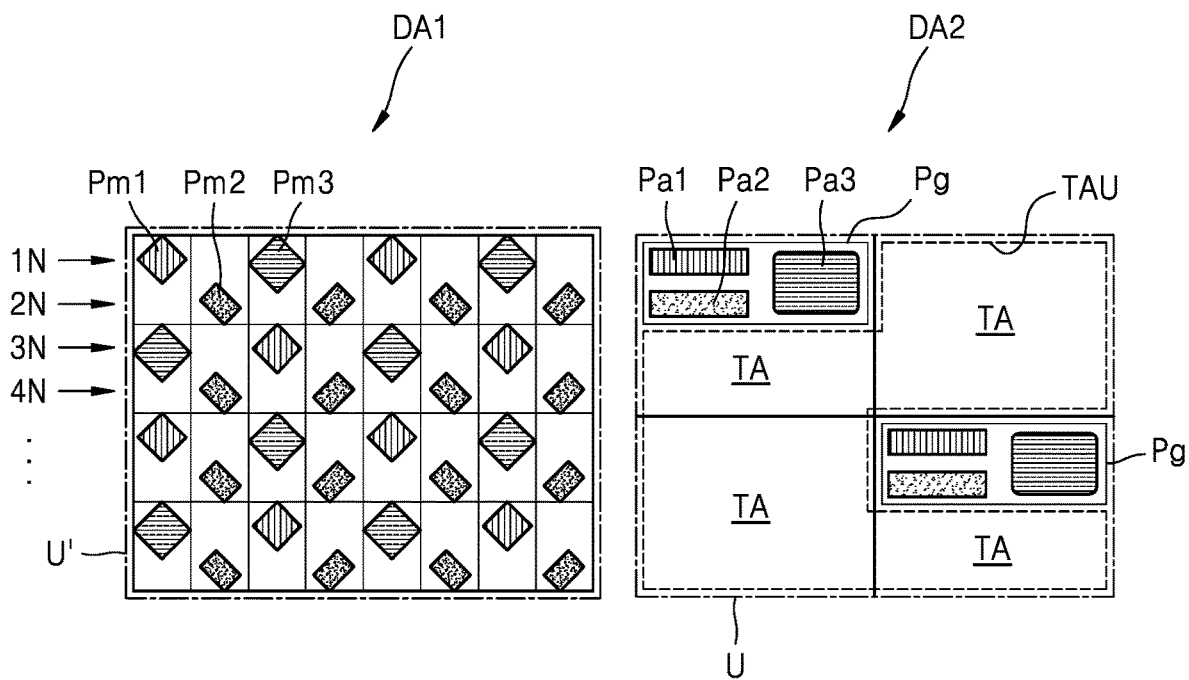
FIG. 10 is a schematic plan view illustrating an arrangement of subpixels and transmission portions in a first display area and a second display area according to another embodiment.

Referring to FIG. 10, the first, second, and third main subpixels Pm1, Pm2, and Pm3 arranged at (e.g., in or on) the first display area DA1 may have different pixel layout structures from those of the first, second, and third auxiliary subpixels Pa1, Pa2, and Pa3 arranged at (e.g., in or on) the second display area DA2. The light-emission area of the third auxiliary subpixel Pa3 may be larger than that of the third main subpixel Pm3, which may represent the same or substantially the same color as that of the third auxiliary subpixel Pa3. For example, according to an embodiment, the third auxiliary subpixel Pa3 and the third main subpixel Pm3 may emit a blue light.

According to an embodiment, the first, second, and third auxiliary subpixels Pa1, Pa2, and Pa3 included in the basic unit U may be arranged in an S-stripe structure, and the first, second, and third auxiliary subpixels Pa1, Pa2, and Pa3 may be classified into two pixel groups Pg that are arranged in the basic unit U. In other words, three first, second, and third auxiliary subpixels Pa1, Pa2, and Pa3 may be arranged in one pixel group Pg, and two pixel groups Pg may be included in each basic unit U. The two pixel groups Pg that are included in each basic unit U may be spaced apart from each other.

In this case, a sum of the respective light-emission areas of the third auxiliary subpixels Pa3 included in the basic unit U may be about 0.5 to 1 times a sum of the respective light-emission areas of the third main subpixels Pm3 included in the corresponding unit U'.

Accordingly, a difference between a brightness realized by the basic unit U and a brightness realized by the corresponding unit U' may be reduced or minimized.

Figure 11:
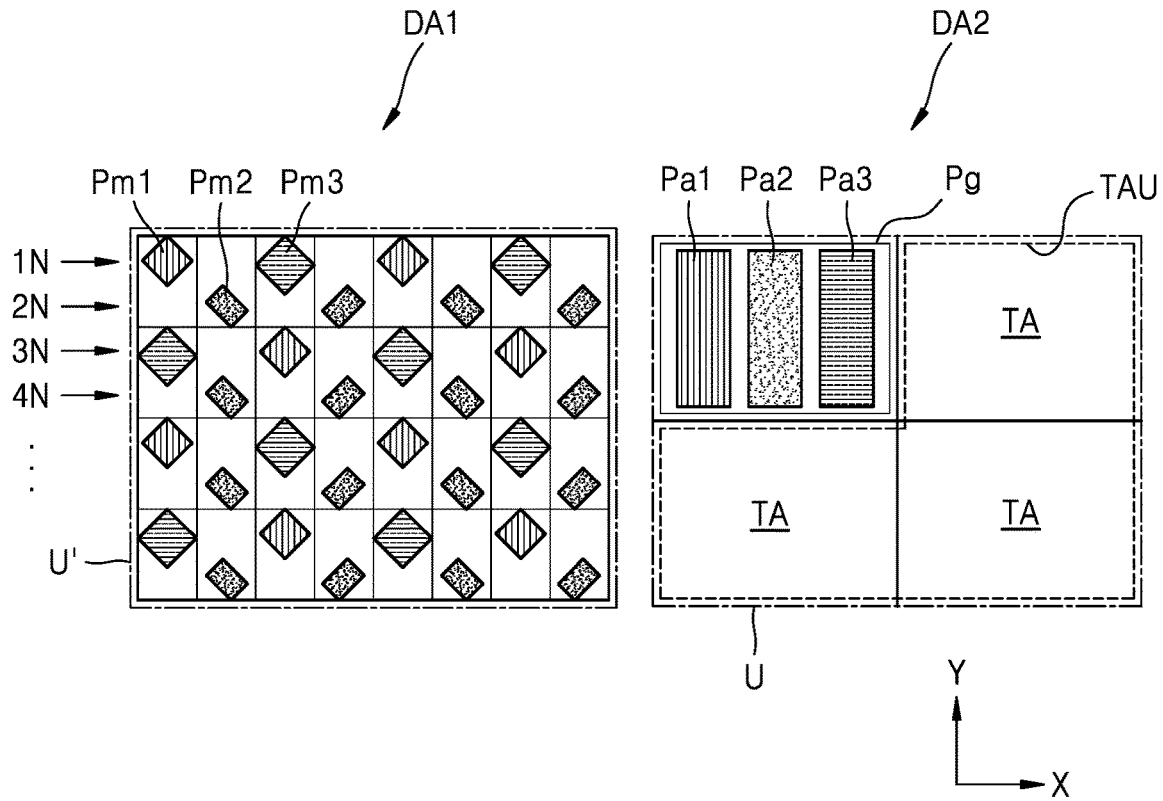
FIG. 11 is a schematic plan view illustrating an arrangement of subpixels and transmission portions in a first display area and a second display area according to another embodiment.

Referring to FIG. 11, the first, second, and third main subpixels Pm1, Pm2, and Pm3 arranged at (e.g., in or on) the first display area DA1 may have different pixel layout structures from those of the first, second, and third auxiliary subpixels Pa1, Pa2, and Pa3 arranged at (e.g., in or on) the second display area DA2. The light-emission area of the third auxiliary subpixel Pa3 may be larger than that of the third main subpixel Pm3, which may represent the same or substantially the same color as that of the third auxiliary subpixel Pa3. For example, according to an embodiment, the third auxiliary subpixel Pa3 and the third main subpixel Pm3 may emit a blue light.

According to an embodiment, the first, second, and third auxiliary subpixels Pa1, Pa2, and Pa3 included in the basic unit U may be arranged in a stripe layout. In other words, the first auxiliary subpixel Pa1, the second auxiliary subpixel Pa2, and the third auxiliary subpixel Pa3 may be arranged (e.g., may be juxtaposed) along the x-axis direction. Each of the first auxiliary subpixel Pa1, the second auxiliary subpixel Pa2, and the third auxiliary subpixel Pa3 may extend in the y-axis direction.

In another embodiment, a first auxiliary subpixel Pa1, a second auxiliary subpixel Pa2, and a third auxiliary subpixel Pa3 may be arranged (e.g., may be juxtaposed) along the y-axis direction. In this case, each of the first auxiliary subpixel Pa1, the second auxiliary subpixel Pa2, and the third auxiliary subpixel Pa3 may extend in the x-axis direction.

According to an embodiment, a sum of the respective light-emission areas of the third auxiliary subpixels Pa3 included in the basic unit U may be about 0.5 to 1 times a sum of the respective light-emission areas of the third main subpixels Pm3 included in the corresponding unit U'.

According to an embodiment, the light-emission area of the first auxiliary subpixel Pa1 may be larger than that of the first main subpixel Pm1, which may represent the same or substantially the same color as that of the first auxiliary subpixel Pa1.

According to an embodiment, the light-emission area of the second auxiliary subpixel Pa2 may be larger than that of the second main subpixel Pm2, which may represent the same or substantially the same color as that of the second auxiliary subpixel Pa2.

Accordingly, a difference between a brightness realized by the basic unit U and a brightness realized by the corresponding unit U' may be reduced or minimized.

Figure 12:
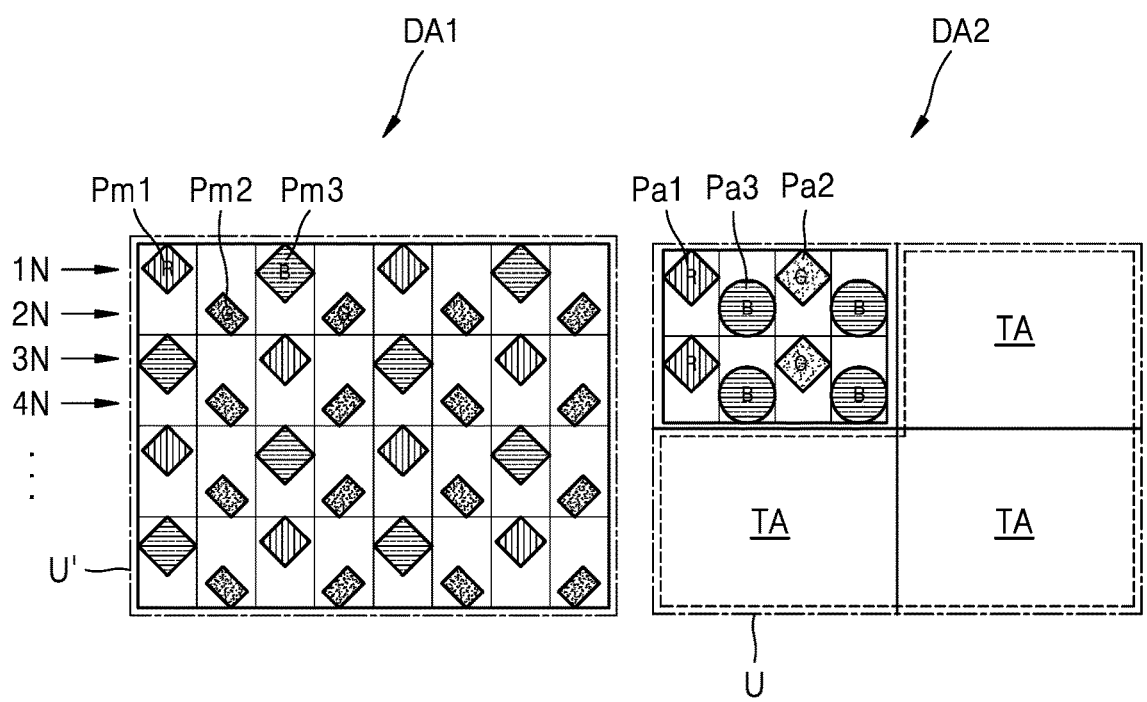
FIG. 12 is a schematic plan view illustrating an arrangement of subpixels and transmission portions in a first display area and a second display area according to another embodiment.

Referring to FIG. 12, the first, second, and third main subpixels Pm1, Pm2, and Pm3 arranged at (e.g., in or on) the first display area DA1 may have different pixel layout structures from those of the first, second, and third auxiliary subpixels Pa1, Pa2, and Pa3 arranged at (e.g., in or on) the second display area DA2. The light-emission area of the third auxiliary subpixel Pa3 may be larger than that of the third main subpixel Pm3, which may represent the same or substantially the same color as that of the third auxiliary subpixel Pa3.

According to an embodiment, the first main subpixels Pm1 and the first auxiliary subpixels Pa1 may represent a red color, the second main subpixels Pm2 and the second auxiliary subpixels Pa2 may represent a green color, and the third main subpixels Pm3 and the third auxiliary subpixels Pa3 may represent a blue color.

According to an embodiment, the third main subpixels Pm3 representing the blue color at (e.g., in or on) the first display area DA1 may be arranged on odd-numbered rows, for example, such as the first row 1N, but the third auxiliary subpixels Pa3 representing the blue color at (e.g., in or on) the second display area DA2 may be arranged on even-numbered rows, for example, such as the second row 2N. In this case, this layout may be referred to as an RGBG pentile matrix structure.

The second main subpixels Pm2 representing the green color at (e.g., in or on) the first display area DA1 may be arranged on even-numbered rows, for example, such as the second row 2N, but the second auxiliary subpixels Pa2 representing the green color at (e.g., in or on) the second display area DA2 may be arranged on odd-numbered rows, for example, such as the first row 1N. In this case, this layout may be referred to as an RBGB pentile matrix structure.

In other words, the positions of the blue subpixels and the green subpixels at (e.g., in or on) the first display area DA1 and the second display area DA2 are different from each other. The third auxiliary subpixels Pa3, which may be blue subpixels, arranged at (e.g., in or on) the second display area DA2 may include larger light-emission areas than those of the third main subpixels Pm3, which may be blue subpixels.

Because the number of third auxiliary subpixels Pa3 arranged at (e.g., in or on) the basic unit U is 4, and the number of third main subpixels Pm3 arranged at (e.g., in or on) the corresponding unit U' is 8, a sum of the respective light-emission areas of the third auxiliary subpixels Pa3 included in the basic unit U may be about 0.5 to 1 times a sum of the respective light-emission areas of the third main subpixels Pm3 included in the corresponding unit U'.

Thus, a light-emission area of blue subpixels that may be prone (e.g., that may be weak) to deterioration may be secured, and thus, a highly-reliable display apparatus may be provided.

As described above, because one or more embodiments of the present disclosure may employ a pixel layout structure in which the auxiliary subpixels included in a second display area are larger than main subpixels included in a first display area, a highly-reliable display apparatus may be provided.

It should be understood that the example embodiments described herein should be considered in a descriptive sense only and not for purposes of limitation. Descriptions of features or aspects within each example embodiment should typically be considered as available for other similar features or aspects in other embodiments, unless otherwise described. While one or more embodiments have been described with reference to the figures, it will be understood by those of ordinary skill in the art that various modifications and changes in form and/or details may be made therein without departing from the spirit and scope of the present disclosure as defined by the following claims, and their equivalents.

What is claimed is:

1. A display apparatus comprising:
a substrate;
a first display area on the substrate;
main subpixels at the first display area;
a second display area on the substrate; and
a basic unit at the second display area, the basic unit comprising auxiliary subpixels and a transmission portion,
wherein a pixel layout of the auxiliary subpixels is different from a pixel layout of the main subpixels,
wherein a size of a light-emission area of a first auxiliary subpixel among the auxiliary subpixels is greater than a size of a light-emission area of a first main subpixel among the main subpixels, the first main subpixel representing the same color as that of the first auxiliary subpixel,
wherein the main subpixels are arranged in a pentile matrix structure, and the auxiliary subpixels are arranged in an S-stripe structure,
wherein the main subpixels include red sub-pixels, green sub-pixels, and blue sub-pixels,
wherein, from among four vertexes of an imaginary quadrangle having a green main subpixel as a center point, red main sub-pixels are disposed at first and third vertices disposed diagonally, and blue main subpixels are disposed at remaining vertices,
wherein the area of the S-stripe structure of the auxiliary subpixels of the basic unit is about ⅓ the area of the transmission portion of the basic unit, and
wherein a corresponding unit at the first display area that has the same sized area as that of the basic unit at the second display area comprises a plurality of the main subpixels arranged in a plurality of the imaginary quadrangle, so that a sum of light-emitting areas of the S-stripe structure of the auxiliary subpixels of the basic unit is about 0.5 to 1 times a sum of light-emitting areas of the main subpixels of the plurality of the imaginary quadrangle in the corresponding unit at the first display area.

2. The display apparatus of claim 1, wherein the first auxiliary subpixel and the first main subpixel are configured to emit a blue light.

3. The display apparatus of claim 1, wherein an area occupied by the transmission portion in the basic unit is about ¾ of the area of the basic unit.

4. The display apparatus of claim 1, wherein the auxiliary subpixels constitute pixel groups that are spaced apart from each other within the basic unit.

5. The display apparatus of claim 1, further comprising an inorganic insulating layer on the substrate,
wherein the inorganic insulating layer has an opening corresponding to the transmission portion.

6. The display apparatus of claim 1, wherein an opposite electrode covering the main subpixels and the auxiliary subpixels extends on the first display area and the second display area, the opposite electrode being integrally formed and having an opening corresponding to the transmission portion.

7. A display apparatus comprising:
a substrate;
a first display area on the substrate;
main subpixels at the first display area;
a second display area on the substrate; and
a basic unit at the second display area, the basic unit comprising auxiliary subpixels and a transmission portion,
wherein a pixel layout of the auxiliary subpixels is different from a pixel layout of the main subpixels,
wherein a size of a light-emission area of a first auxiliary subpixel among the auxiliary subpixels is greater than a size of a light-emission area of a first main subpixel among the main subpixels, the first main subpixel representing the same color as that of the first auxiliary subpixel, and wherein the main subpixels are arranged in an RGBG pentile matrix structure, and the auxiliary subpixels are arranged in an RBGB pentile matrix structure.

8. A display apparatus comprising:

a substrate comprising a first display area and a second display area, the first display area comprising main subpixels, and the second display area comprising a basic unit comprising auxiliary subpixels and a transmission portion;

a first main subpixel among the main subpixels comprising a first pixel electrode and a first emission layer;

a first auxiliary subpixel among the auxiliary subpixels comprising a second pixel electrode and a second emission layer, the first auxiliary subpixel representing the same color as that of the first main subpixel; and an opposite electrode covering the first display area and the second display area, the opposite electrode being integrally formed, wherein a pixel layout structure of the auxiliary subpixels is different from a pixel layout structure of the main subpixels, and a size of a light-emission area of the first auxiliary subpixel is greater than a size of a light-emission area of the first main subpixel, wherein the main subpixels are arranged in a pentile matrix structure, and the auxiliary subpixels are arranged in an S-stripe structure, wherein the main subpixels include red sub-pixels, green sub-pixels, and blue sub-pixels, wherein, from among four vertexes of an imaginary quadrangle having a green main subpixel as a center point, red main sub-pixels are disposed at first and third vertices disposed diagonally, and blue main subpixels are disposed at remaining vertices, wherein the area of the S-stripe structure of the auxiliary subpixels of the basic unit is about ⅓ the area of the transmission portion of the basic unit, and wherein a corresponding unit at the first display area that has the same sized area as that of the basic unit at the second display area comprises a plurality of the main subpixels arranged in a plurality of the imaginary quadrangle, so that a sum of light-emitting areas of the S-stripe structure of the auxiliary subpixels of the basic unit is about 0.5 to 1 times a sum of light-emitting areas of the main subpixels of the plurality of the imaginary quadrangle in the corresponding unit at the first display area.

9. The display apparatus of claim 8, further comprising a functional layer between the first pixel electrode and the opposite electrode, wherein the functional layer is located to correspond to the transmission portion.

10. The display apparatus of claim 8, further comprising a pixel defining layer having a first opening and a second opening exposing center portions of the first pixel electrode and the second pixel electrode, respectively, wherein the light-emission area of the first main subpixel is defined by the first opening, and the light-emission area of the first auxiliary subpixel is defined by the second opening.

11. The display apparatus of claim 8, further comprising an inorganic insulating layer on the substrate, wherein the inorganic insulating layer has an opening corresponding to the transmission portion.

12. The display apparatus of claim 8, wherein the first display area and the second display area are sealed by an encapsulation substrate facing the substrate.

13. The display apparatus of claim 8, further comprising a thin-film encapsulation layer comprising a first inorganic encapsulation layer, an organic encapsulation layer, and a second inorganic encapsulation layer sequentially on the opposite electrode.

14. The display apparatus of claim 8, wherein the first auxiliary subpixel and the first main subpixel are configured to emit a blue light.

15. A display apparatus comprising:

a substrate comprising a first display area and a second display area, the first display area comprising main subpixels, and the second display area comprising auxiliary subpixels and a transmission portion;

a first main subpixel among the main subpixels comprising a first pixel electrode and a first emission layer;

a first auxiliary subpixel among the auxiliary subpixels comprising a second pixel electrode and a second emission layer, the first auxiliary subpixel representing the same color as that of the first main subpixel; and an opposite electrode covering the first display area and the second display area, the opposite electrode being integrally formed, wherein a pixel layout structure of the auxiliary subpixels is different from a pixel layout structure of the main subpixels, and a size of a light-emission area of the first auxiliary subpixel is greater than a size of a light-emission area of the first main subpixel, and wherein the main subpixels are arranged in an RGBG pentile matrix structure, and the auxiliary subpixels are arranged in an RBGB pentile matrix structure.

* * * * *